(12) United States Patent  
Suzuki

(10) Patent No.: US 8,937,568 B2  
(45) Date of Patent: Jan. 20, 2015

(54) D/A CONVERTER

(71) Applicant: Fujitsu Semiconductor Limited, Yokohama (JP)

(72) Inventor: Hisao Suzuki, Nagoya (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/163,787

(22) Filed: Jan. 24, 2014

(65) Prior Publication Data

US 2014/0210657 A1 Jul. 31, 2014

(30) Foreign Application Priority Data

Jan. 31, 2013 (JP) ................................. 2013-016672

(51) Int. Cl.
*H03M 1/78* (2006.01)
*H03M 1/08* (2006.01)

(52) U.S. Cl.
CPC ............ *H03M 1/785* (2013.01); *H03M 1/0863* (2013.01)
USPC ........................................................ 341/154

(58) Field of Classification Search
CPC ... H03M 1/0678; H03M 1/0863; H03M 1/78; H03M 1/1785; H03M 1/80
USPC ........................................................ 341/154
See application file for complete search history.

(56) References Cited

U.S. PATENT DOCUMENTS

| 4,636,772 | A | * | 1/1987 | Yasunaga | 341/154 |
| 4,713,649 | A | * | 12/1987 | Hino | 341/133 |
| 5,387,912 | A | * | 2/1995 | Bowers | 341/118 |
| 5,455,582 | A | * | 10/1995 | Valdenaire | 341/154 |
| 5,969,658 | A | * | 10/1999 | Naylor | 341/154 |
| 2001/0033242 | A1 | * | 10/2001 | Castaneda et al. | 341/154 |

FOREIGN PATENT DOCUMENTS

JP 58-168325 A 10/1983
JP 2008228102 A * 9/2008

* cited by examiner

*Primary Examiner* — Howard Williams
(74) *Attorney, Agent, or Firm* — Arent Fox LLP

(57) ABSTRACT

A digital-to-analog (D/A) converter includes first resistors coupled in series, second resistors respectively coupled to the first resistors and each having a resistance twice as large as the resistance of the first resistor, and first switch circuits respectively coupled to the second resistors. Third resistors each have a resistance twice as large as the resistance of the first resistor. Second switch circuits each are coupled to the third resistors and a GND wire. A control circuit controls the first and second switch circuit in accordance with the digital input signals to set a state of a connection node to either one of a first voltage, a second voltage, and a high impedance.

13 Claims, 21 Drawing Sheets

Fig.2A

| | P-Channel MOS Transistor | | (Gate Area) | N-Channel MOS Transistor | | (Gate Area) | On Resistance |
|---|---|---|---|---|---|---|---|
| A | TP5 | m=8 | (WpXLpX8) | TN5, T5 | m=8 | (WnXLnX8) | Reference (X1) |
| B | TP4 | m=4 | (WpXLpX4) | TN4, T4 | m=4 | (WnXLnX4) | X2 |
| C | TP3 | m=2 | (WpXLpX2) | TN3, T3 | m=2 | (WnXLnX2) | X4 |
| D | TP2 | Double Stack (m=2) | (WpXLpX4) | TN2, T2 | Double Stack (m=2) | (WnXLnX4) | X8 |
| E | TP1 | Quadruple Stack (m=2) | (WpXLpX8) | TN1, T1 | Quadruple Stack (m=2) | (WnXLnX8) | X16 |
| F | TP0 | Octuple Stack (m=2) | (WpXLpX16) | TN0, T0 | Octuple Stack (m=2) | (WnXLnX16) | X32 |

Fig.2B
m=2

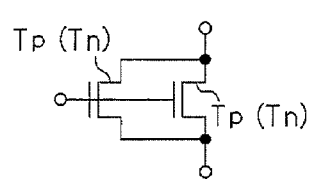

Fig.2C
Double Stack (m=2)

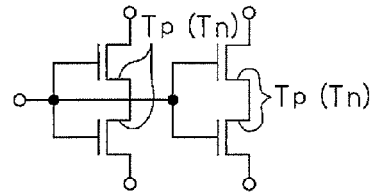

Fig.2D

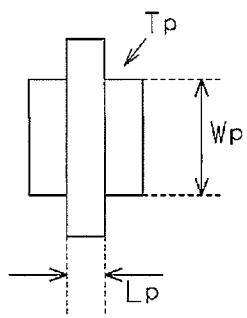

Fig.2E

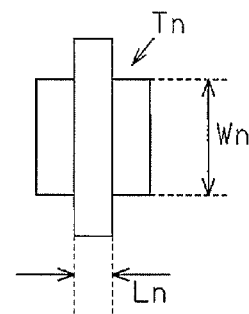

Fig.3

| | P-Channel MOS Transistor | (Gate Area) | N-Channel MOS Transistor | | (Gate Area) | On Resistance |
|---|---|---|---|---|---|---|
| A | TP5 | m=64 | (WpXLpX64) | TN5, T5 | m=64 | (WnXLnX64) | Reference (X1) |
| B | TP4 | m=32 | (WpXLpX32) | TN4, T4 | m=32 | (WnXLnX32) | X2 |
| C | TP3 | m=16 | (WpXLpX16) | TN3, T3 | m=16 | (WnXLnX16) | X4 |
| D | TP2 | m=8 | (WpXLpX8) | TN2, T2 | m=8 | (WnXLnX8) | X8 |
| E | TP1 | m=4 | (WpXLpX4) | TN1, T1 | m=4 | (WnXLnX4) | X16 |
| F | TP0 | m=2 | (WpXLpX2) | TN0, T0 | m=2 | (WnXLnX2) | X32 |

Fig.5
VD=6.4V, GND=0.0V

| Code | N5 | NS5 | N4 | NS4 | N3 | NS3 | N2 | NS2 | N1 | NS1 | N0 | NS0 | Vo |
|---|---|---|---|---|---|---|---|---|---|---|---|---|---|
| 0 | L | L | – | – | – | – | – | – | – | – | – | – | 0.0V |
| 1 | L | – | L | – | L | – | L | – | L | – | H | L | 0.1V |
| 2 | L | – | L | – | L | – | L | – | H | L | – | – | 0.2V |
| 3 | L | – | L | – | L | – | L | – | H | – | H | L | 0.3V |
| 4 | L | – | L | – | L | – | H | L | – | – | – | – | 0.4V |
| 5 | L | – | L | – | L | – | H | – | L | – | H | L | 0.5V |
| 6 | L | – | L | – | L | – | H | – | H | L | – | – | 0.6V |
| 7 | L | – | L | – | L | – | H | – | H | – | H | L | 0.7V |
| 8 | L | – | L | – | H | L | – | – | – | – | – | – | 0.8V |
| 9 | L | – | L | – | H | – | L | – | L | – | H | L | 0.9V |
| 10 | L | – | L | – | H | – | L | – | H | L | – | – | 1.0V |
| 11 | L | – | L | – | H | – | L | – | H | – | H | L | 1.1V |
| 12 | L | – | L | – | H | – | H | L | – | – | – | – | 1.2V |
| 13 | L | – | L | – | H | – | H | – | L | – | H | L | 1.3V |
| 14 | L | – | L | – | H | – | H | – | H | L | – | – | 1.4V |
| 15 | L | – | L | – | H | – | H | – | H | – | H | L | 1.5V |
| 16 | L | – | H | L | – | – | – | – | – | – | – | – | 1.6V |
| 17 | L | – | H | – | L | – | L | – | L | – | H | L | 1.7V |
| 18 | L | – | H | – | L | – | L | – | H | L | – | – | 1.8V |
| 19 | L | – | H | – | L | – | L | – | H | – | H | L | 1.9V |
| 20 | L | – | H | – | L | – | H | L | – | – | – | – | 2.0V |
| 21 | L | – | H | – | L | – | H | – | L | – | H | L | 2.1V |
| 22 | L | – | H | – | L | – | H | – | H | L | – | – | 2.2V |
| 23 | L | – | H | – | L | – | H | – | H | – | H | L | 2.3V |
| 24 | L | – | H | – | H | L | – | – | – | – | – | – | 2.4V |
| 25 | L | – | H | – | H | – | L | – | L | – | H | L | 2.5V |
| 26 | L | – | H | – | H | – | L | – | H | L | – | – | 2.6V |
| 27 | L | – | H | – | H | – | L | – | H | – | H | L | 2.7V |
| 28 | L | – | H | – | H | – | H | L | – | – | – | – | 2.8V |
| 29 | L | – | H | – | H | – | H | – | L | – | H | L | 2.9V |
| 30 | L | – | H | – | H | – | H | – | H | L | – | – | 3.0V |
| 31 | L | – | H | – | H | – | H | – | H | – | H | L | 3.1V |
| 32 | H | L | – | – | – | – | – | – | – | – | – | – | 3.2V |
| 33 | H | – | L | – | L | – | L | – | L | – | H | L | 3.3V |
| 34 | H | – | L | – | L | – | L | – | H | L | – | – | 3.4V |
| 35 | H | – | L | – | L | – | L | – | H | – | H | L | 3.5V |
| 36 | H | – | L | – | L | – | H | L | – | – | – | – | 3.6V |
| ⋮ | ⋮ | ⋮ | ⋮ | ⋮ | ⋮ | ⋮ | ⋮ | ⋮ | ⋮ | ⋮ | ⋮ | ⋮ | ⋮ |
| 60 | H | – | H | – | H | – | H | L | – | – | – | – | 6.0V |
| 61 | H | – | H | – | H | – | H | – | L | – | H | L | 6.1V |
| 62 | H | – | H | – | H | – | H | – | H | L | – | – | 6.2V |
| 63 | H | – | H | – | H | – | H | – | H | – | H | L | 6.3V |

–: OPEN

Code 32

VD=6.4V, GND=0.0V

| Code | D5 | D4 | D3 | D2 | D1 | D0 | Vo |
|------|----|----|----|----|----|----|-----|
| 0 | L | L | L | L | L | L | 0.0V |
| 1 | L | L | L | L | L | H | 0.1V |
| 2 | L | L | L | L | H | L | 0.2V |
| 3 | L | L | L | L | H | H | 0.3V |
| 4 | L | L | L | H | L | L | 0.4V |
| 5 | L | L | L | H | L | H | 0.5V |
| 6 | L | L | L | H | H | L | 0.6V |
| 7 | L | L | L | H | H | H | 0.7V |
| 8 | L | L | H | L | L | L | 0.8V |
| 9 | L | L | H | L | L | H | 0.9V |
| ⋮ | ⋮ | ⋮ | ⋮ | ⋮ | ⋮ | ⋮ | ⋮ |
| 56 | H | H | H | L | L | L | 5.6V |
| 57 | H | H | H | L | L | H | 5.7V |
| 58 | H | H | H | L | H | L | 5.8V |
| 59 | H | H | H | L | H | H | 5.9V |
| 60 | H | H | H | H | L | L | 6.0V |
| 61 | H | H | H | H | L | H | 6.1V |
| 62 | H | H | H | H | H | L | 6.2V |
| 63 | H | H | H | H | H | H | 6.3V |

D/A CONVERTER

CROSS-REFERENCE TO RELATED APPLICATIONS

This application is based upon and claims the benefit of priority from prior Japanese Patent Application No. 2013-016672, filed on Jan. 31, 2013, the entire contents of which are incorporated herein by reference.

FIELD

The present disclosure relates to a digital-to-analog (D/A) converter.

BACKGROUND

An R-2R type D/A converter that uses an R-2R ladder resistor network is known as one of D/A converters for converting digital input signals into an analog signal (Japanese Examined Patent Publication No. 63-47289, for example).

Referring to FIG. 19, a conventional R-2R type D/A converter 100 includes a resistor network 110 and six switches 200 to 205 corresponding to 6-bit digital input signals D0 to D5. The switches 200 to 205 include transistors 200a to 205a that are coupled between a wire 220 with a high voltage VD level and the resistor network 110, and transistors 200b to 205b that are coupled between the resistor network 110 and a wire 221 with a low voltage GND level, respectively. The transistors 200a to 205a and the transistors 200b to 205b turn on/off complementarily, according to the digital input signals D0 to D5. In an illustrated embodiment, each of the switches 200 to 205 is a CMOS inverter circuit.

The R-2R type D/A converter 100 outputs an analog signal Vo having a voltage value obtained by dividing a voltage difference between the high voltage VD and the low voltage GND by resistors contained in the resistor network 110 and on-resistances of the respective transistors 200a to 205a and 200b to 205b. As illustrated in FIG. 20, for example, the R-2R type D/A converter 100 outputs the analog signal Vo having the voltage value corresponding to a code (decimal number) and setting codes (binary numbers represented by the digital input signals D0 to D5). With regard to the voltage value of the analog signal Vo in FIG. 20, the high voltage VD is 6.4 [V], and the low voltage GND is 0 [V]. Each code is the decimal number corresponding to the set of the binary numbers represented by the digital input signals D0 to D5.

SUMMARY

In the R-2R type D/A converter 100 as illustrated in FIG. 19, sizes of the transistors 200a to 205a and 200b to 205b are weighted according to the digital input signals D0 to D5. In FIG. 19, a numerical value illustrated next to each of the transistors 200a to 205a and 200b to 205b represents a ratio of the transistor size. Namely, the notation of "×1" means one time, the notation of "×2" means two times, the notation of "×4" means four times, the notation of "×8" means eight times, the notation of "×16" means 16 times, and the notation of "×32" means 32 times. Accordingly, the sizes of the transistors 200a to 205a and the sizes of the transistors 200b to 205b are weighted in a binary (power of two) ratio.

The transistor sizes are weighted in order to suppress deterioration in D/A conversion accuracy such as differential nonlinearity (DNL) of the R-2R type D/A converter 100. For example, current values flowing through the resistors contained in the resistor network 110 vary according to the setting codes (logic levels of the digital input signals D0 to D2). Here, as illustrated in FIG. 19 and FIG. 21, the switch 200 has on-resistance R200, the switch 201 has on-resistance R201, the switch 202 has on-resistance R202, the switch 203 has on-resistance R203, the switch 204 has on-resistance R204, and the switch 205 has on-resistance R205. Supposing that the resistance values of the on-resistances R200 to R205 are identical to each other, terminal voltages of terminals a to f of the resistors that are coupled to the on-resistances R200 to R205 vary due to the current flowing through the resistors contained in the resistor network 110. The variations in the terminal voltages increase the DNL. For this reason, DNL characteristics deteriorate significantly, as illustrated in FIG. 22, when the resistance values of the on-resistances R200 to R205 are identical to each other. Here, a DNL waveform in FIG. 22 illustrates the size of the DNL (vertical axis) relative to the respective codes (horizontal axis), and illustrates the DNL characteristics when the resistance values of the on-resistances R200 to R205 are identical to each other. The DNL is an error of a step size from the ideal step size in the analog signal Vo as D/A conversion output. Therefore, it is possible to consider that the DNL characteristics are excellent when the DNL according to each code has the value closer to zero, and the DNL characteristics are deteriorated when the DNL according to each code has the value separated from zero.

It is possible to obtain the excellent DNL characteristics, as illustrated in FIG. 23, when the transistor sizes of the transistors 200a to 205a and 200b to 205b are weighted in the binary ratio, as illustrated in FIG. 19, contrary to the above-described case where the resistance values of the on-resistances R200 to R205 are identical to each other. For example, when the transistor sizes of the transistors 200a to 205a and 200b to 205b are weighted, as illustrated in FIG. 19, the resistance values of the on-resistance R205 to R200 are weighted in the binary ratio. For example, the resistance value of the on-resistance R204 is twice, the resistance value of the on-resistance R203 is four times, the resistance value of the on-resistance R202 is eight times, the resistance value of the on-resistance R201 is 16 times, and the resistance value of the on-resistance R200 is 32 times as large as the resistance value of the on-resistance R205 as the reference. When, for example, the on-resistance R205 is set as 0.2 [kΩ], the on-resistance R204 becomes 0.4 [kΩ], the on-resistance R203 becomes 0.8 [kΩ], the on-resistance R202 becomes 1.6 [kΩ], the on-resistance R201 becomes 3.2 [kΩ], and the on-resistance R200 becomes 6.4 [kΩ]. When the resistance values of the on-resistances R205 to R200 are weighted in the binary ratio like this, the variations in the terminal voltages of the terminals a to f may be suppressed, and the excellent DNL characteristics, as illustrated in FIG. 23, may be obtained.

However, when bits are increased in the R-2R type D/A converter 100, variation ranges of the resistance values of the on-resistances R200 to R205 are increased, and the DNL characteristics (D/A conversion accuracy) are deteriorated.

For example, the DNL waveform in FIG. 23 illustrates the DNL characteristics at the time when resistance components of the switches 200 to 205 are handled as fixed values. However, with the actual R-2R type D/A converter 100, the on-resistances of the transistors 200a to 205a and 200b to 205b become the resistance components of the switches 200 to 205. Here, the on-resistance of a MOS transistor varies according to a voltage value applied from a drain terminal to a source terminal of the MOS transistor. For this reason, the on-resistance values of the transistors 200a to 205a and 200b to 205b vary according to the change in the setting codes (logic levels of the digital input signals D0 to D5). Consequently, errors are caused between the on-resistance values of the transistors 200a to 205a and 200b to 205b and the resistance values weighted in the binary ratio, according to the change in the setting codes, and the variations are caused in the terminal voltages of the terminals a to f, as a result of which the D/A conversion accuracy (DNS characteristics) is deteriorated.

According to an aspect of the invention, a digital-to-analog (D/A) converter that generates an analog signal according to digital input signals, includes a plurality of first resistors coupled in series between a first output terminal and a second output terminal from which the analog signal is outputted, the first resistors having a same resistance. A plurality of second resistors include first terminals respectively coupled to the plurality of first resistors and each have a resistance twice as large as the resistance of the first resistor. The first output terminal is coupled to the first terminal of one of the plurality of second resistors. A plurality of first switch circuits are respectively coupled to second terminals of the plurality of the second resistors. A third resistor having a resistance twice as large as the resistance of the first resistor includes a first terminal coupled to one of the first terminals of the second resistors except for one second resistor that is coupled to the first output terminal. A second switch circuit includes a first terminal coupled to a second terminal of the third resistor and a second terminal coupled to a first wire. A control circuit is coupled to the first and second switch circuits and is configured to generate a first signal to control the first switch circuits and to generate a second signal to control the second switch circuit, in accordance with the digital input signals. One or more of the plurality of the first switch circuits, which is coupled to the second resistor that is coupled to a node between the first output terminal and a connection node arranged between two adjacent first resistors and to which the first terminal of the third resistor is coupled, is controlled to set a state of a connection node arranged between the one or more first switch circuit and the corresponding second resistor to either one of a first voltage, a second voltage that is different from the first voltage, and a high impedance.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF DRAWINGS

FIGS. 2A to 2E are schematic diagrams explaining a weighting method of switches;

FIG. 3 is a schematic diagram explaining the weighting method of the switches;

FIG. 5 is a schematic diagram explaining the operation of the D/A converter according to the embodiment;

DESCRIPTION OF EMBODIMENTS

Hereinafter, an embodiment will be explained with reference to FIG. 1 to FIG. 11.

Figure 1:
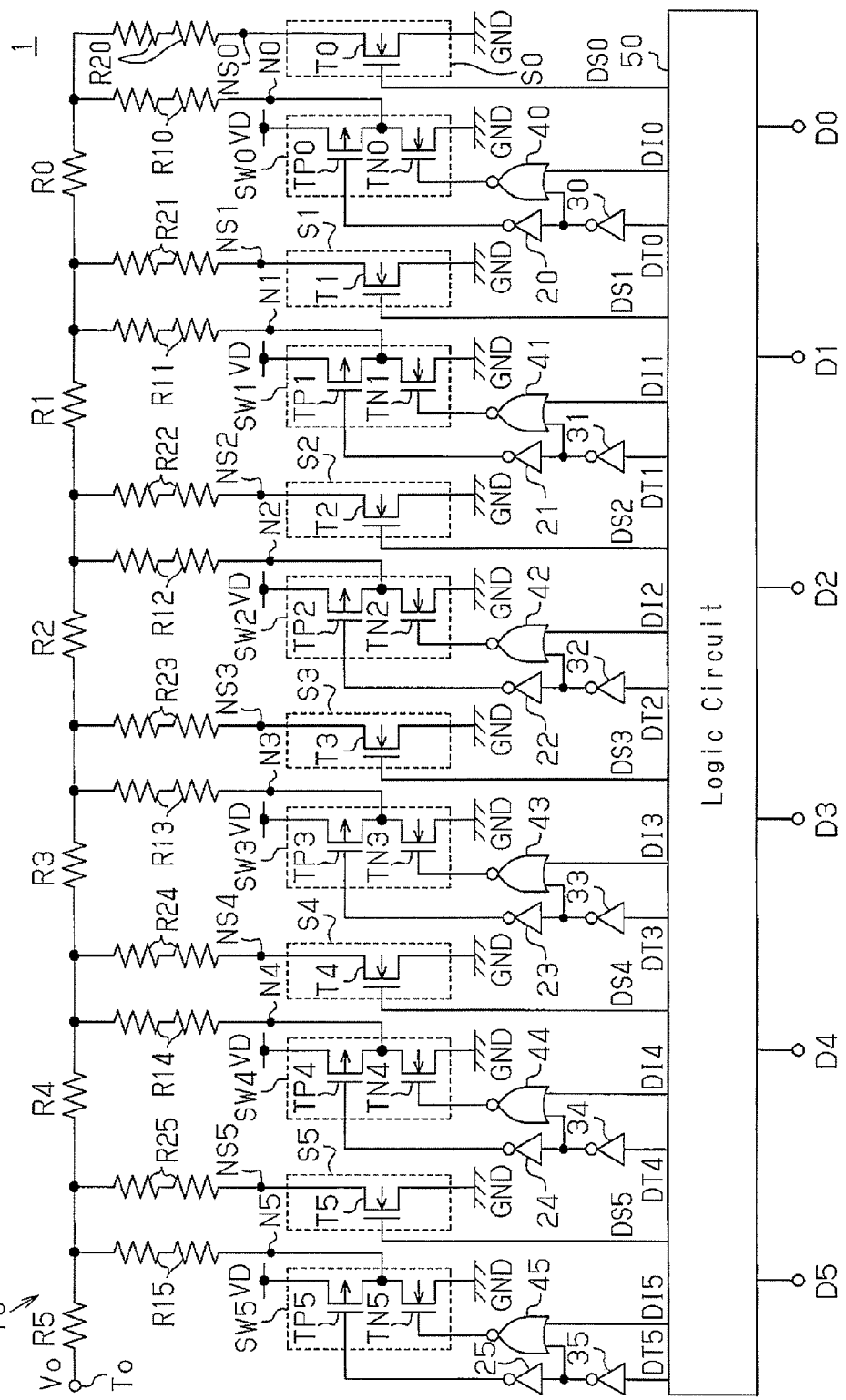
FIG. 1 is a block circuit diagram of a D/A converter according to an embodiment.

Referring to FIG. 1, a digital-to-analog (D/A) converter 1 according to an embodiment may be an R-2R type D/A converter. The D/A converter 1 generates an analog signal Vo having voltage values corresponding to 6-bit digital input signals D0 to D5. The digital input signal D0 is the least significant bit (LSB), the digital input signal D1 is the second least significant bit, the digital input signal D2 is the third least significant bit, and the digital input signal D3 is the fourth least significant bit. Further, the digital input signal D4 is the fifth least significant bit, and the digital input signal D5 is the most significant bit (MSB).

The D/A converter 1 includes a resistor network 10, switch circuits SW0 to SW5 respectively corresponding to the digital input signals D0 to D5, switch circuits S0 to S5, inverter circuits 20 to 25 and 30 to 35, NOR circuits 40 to 45, and a logic circuit 50 to which the digital input signals D0 to D5 are inputted. Here, the switch circuits SW0, SW1, SW2, SW3, SW4 and SW5 are switches provided corresponding to the digital input signals D0, D1, D2, D3, D4 and D5, respectively. The switch circuits S0, S1, S2, S3, S4 and S5 are switches provided corresponding to the digital input signals D0, D1, D2, D3, D4 and D5, respectively.

The resistor network 10 includes resistors R0 to R5 that are coupled in series between a first output terminal and a second output terminal To, resistors R10 to R15 that are respectively coupled to the switch circuits SW0 to SW5, and resistors R20 to R25 that are respectively coupled to first terminals of the resistors R10 to R15. Resistance the resistors R0 to R5 each have a same resistance R. The resistance of each of the resistors R10 to R15 is set to be twice (2R) as large as the resistance R of each of the resistors R0 to R5. The resistance of each of the resistors R20 to R25 is set to be twice (2R) as large as the resistance R of each of the resistors R0 to R5. Namely, the resistance of each of the resistors R20 to R25 is set as the resistance 2R that is equal to the resistance 2R of each of the resistors R10 to R15. In FIG. 1, each of the resistors R0 to R5 is illustrated by one resistance symbol, and each of the resistors R10 to R15 and the resistors R20 to R25 is illustrated by two resistance symbols, in order to facilitate understanding of the resistances of the resistors R0 to R5, R10 to R15, and the resistors R20 to R25. Each of the resistors R10 to R15 and R20 to R25, having the resistance 2R, may have such a circuit structure as to connect the two resistances, each having the resistance R, in series. The resistors R10, R11, R12, R13, R14 and R15 are resistances provided corresponding to the digital input signals D0, D1, D2, D3, D4 and D5, respectively.

The resistors R0 to R5 are coupled in series. The first terminals of the resistors R10 to R15 and first terminals of the resistors R20 to R25 are coupled to nodes to which the resistors R0 to R5 are coupled. For example, the first terminal of the resistor R10 and the first terminal of the resistor R20 are coupled to a first terminal of the resistor R0 (right terminal in FIG. 1), that is, the first output terminal. The first terminal of the resistor R11 and the first terminal of the resistor R21 are coupled to the connection node to which a second terminal of the resistor R0 and a first terminal of the resistor R1 are coupled. The first terminal of the resistor R12 and the first terminal of the resistor R22 are coupled to the connection node to which a second terminal of the resistor R1 and a first terminal of the resistor R2 are coupled. The first terminal of the resistor R13 and the first terminal of the resistor R23 are coupled to the connection node to which a second terminal of the resistor R2 and a first terminal of the resistor R3 are coupled. The first terminal of the resistor R14 and the first terminal of the resistor R24 are coupled to the connection node to which a second terminal of the resistor R3 and a first terminal of the resistor R4 are coupled. The first terminal of the resistor R15 and the first terminal of the resistor R25 are coupled to the connection node to which a second terminal of the resistor R4 and a first terminal of the resistor R5 are coupled. A second terminal of the resistor R5 is coupled to the second output terminal To.

A second terminal of the resistor R10 is coupled to the switch circuit SW0, a second terminal of the resistor R11 is coupled to the switch circuit SW1, and a second terminal of the resistor R12 is coupled to the switch circuit SW2. A second terminal of the resistor R13 is coupled to the switch circuit SW3, a second terminal of the resistor R14 is coupled to the switch circuit SW4, and a second terminal of the resistor R15 is coupled to the switch circuit SW5. The first terminal of the resistor R20 is coupled to the first terminal of the resistor R10, and a second terminal of the resistor R20 is coupled to the switch circuit S0. The first terminal of the resistor R21 is coupled to the first terminal of the resistor R11, and a second terminal of the resistor R21 is coupled to the switch circuit S1. The first terminal of the resistor R22 is coupled to the first terminal of the resistor R12, and a second terminal of the resistor R22 is coupled to the switch circuit S2. The first terminal of the resistor R23 is coupled to the first terminal of the resistor R13, and a second terminal of the resistor R23 is coupled to the switch circuit S3. The first terminal of the resistor R24 is coupled to the first terminal of the resistor R14, and a second terminal of the resistor R24 is coupled to the switch circuit S4. The first terminal of the resistor R25 is coupled to the first terminal of the resistor R15, and a second terminal of the resistor R25 is coupled to the switch circuit S5.

The switch circuit SW0 includes two transistors TP0 and TN0. For example, the transistor TP0 is a P-channel MOS transistor, and the transistor TN0 is an N-channel MOS transistor. A source terminal of the transistor TP0 is coupled to a wire supplying a high voltage VD (hereinafter also referred to as a VD line). A drain terminal of the transistor TP0 is coupled to the second terminal of the resistor R10 and a drain terminal of the transistor TN0. For example, the drain terminals of the transistors TP0 and TN0 are coupled to a node N0 to which the second terminal of the resistor R10 and an output terminal of the switch circuit SW0 are coupled. A source terminal of the transistor TN0 is coupled to a wire supplying a low voltage GND (hereinafter also referred to as a GND line). A gate terminal of the transistor TP0 is coupled to an output terminal of the inverter circuit 20. An input terminal of the inverter circuit 20 is coupled to an output terminal of the inverter circuit 30, and a signal DT0 is supplied to the inverter circuit 30 from the logic circuit 50. A gate terminal of the transistor TN0 is coupled to an output terminal of the NOR circuit 40. An output signal of the inverter circuit 30 is supplied to the NOR circuit 40, and a signal DI0 is supplied to the NOR circuit 40 from the logic circuit 50.

The transistor TP0 turns on/off according to a logic level ("0 (logic L-level)" or "1 (logic H-level)") of the signal DT0. Further, the transistor TN0 turns on/off according to the logic level of the signal DT0 and the logic level ("0 (logic L-level)" or "1 (logic H-level)") of the signal DI0.

For example, when the L-level signal DT0 is outputted from the logic circuit 50, the transistor TP0 turns on in response to the L-level signal outputted from the inverter circuit 20, and the transistor TN0 turns off in response to the L-level signal outputted from the NOR circuit 40. When the transistor TP0 turns on like this, the node N0 is coupled to the VD line, and the voltage of the node N0 is set as a H-level (high voltage VD level). For example, the node N0 is pulled up to the high voltage VD level by the transistor TP0 that is turned on. Further, when the H-level signal DT0 and the L-level signal DI0 are outputted from the logic circuit 50, the transistor TP0 turns off in response to the H-level signal outputted from the inverter circuit 20, and the transistor TN0 turns on in response to the H-level signal outputted from the NOR circuit 40. When the transistor TN0 turns on like this, the node N0 is coupled to the GND line, and the voltage of the node N0 is set as a L-level (low voltage GND level). For example, the node N0 is pulled down to the low voltage GND level by the transistor TN0 that is turned on. Furthermore, when the H-level signal DT0 and the H-level signal DI0 are outputted from the logic circuit 50, the transistor TP0 turns off in response to the H-level signal outputted from the inverter circuit 20, and the transistor TN0 turns off in response to the L-level signal outputted from the NOR circuit 40. When both of the transistors TP0 and TN0 turn off like this, the node N0 is discoupled from the VD line and the GND line and becomes an open state. When both of the transistors TP0 and TN0 turn off, the node N0 becomes a high-impedance state. Thus, the switch circuit SW0 is a tri-state buffer circuit that sets the node N0 as the H-level, the L-level or the high impedance state, in response to the signals DT0 and DI0.

Structures of the switch circuits SW1 to SW5 are the same as that of the switch circuit SW0, and will be explained briefly here.

The switch circuit SW1 is a tri-state buffer circuit that sets a node N1 as the H-level, the L-level or the high impedance state, similarly to the switch circuit SW0. The switch circuit SW1 includes two transistors TP1 and TN1. For example, the transistor TP1 is the P-channel MOS transistor, and the transistor TN1 is the N-channel MOS transistor. A source terminal of the transistor TP1 is coupled to the VD line. A drain terminal of the transistor TP1 is coupled to the second terminal of the resistor R11 and a drain terminal of the transistor TN1. The drain terminals of the transistors TP1 and TN1 are coupled to the node N1 to which the second terminal of the resistor R11 and an output terminal of the switch circuit SW1 are coupled. A source terminal of the transistor TN1 is coupled to the GND line. A gate terminal of the transistor TP1 is coupled to an output terminal of the inverter circuit 21. An input terminal of the inverter circuit 21 is coupled to an output terminal of the inverter circuit 31, and a signal DT1 is supplied to the inverter circuit 31 from the logic circuit 50. A gate terminal of the transistor TN1 is coupled to an output terminal of the NOR circuit 41. An output signal of the inverter circuit 31 is supplied to the NOR circuit 41, and a signal DI1 is supplied to the NOR circuit 41 from the logic circuit 50.

The transistor TP1 turns on/off according to the logic level ("0" or "1") of the signal DT1. Further, the transistor TN1 turns on/off according to the logic level of the signal DT1 and the logic level ("0" or "1") of the signal DI1. In the switch circuit SW1, at least one of the transistors TP1 and TN1 is turned off in response to the signals DT1 and DI1.

The switch circuit SW2 is a tri-state buffer circuit that sets a node N2 as the H-level, the L-level or the high impedance state, similarly to the switch circuit SW0. The switch circuit SW2 includes two transistors TP2 and TN2. For example, the transistor TP2 is the P-channel MOS transistor, and the transistor TN2 is the N-channel MOS transistor. A source terminal of the transistor TP2 is coupled to the VD line. A drain terminal of the transistor TP2 is coupled to the second terminal of the resistor R12 and a drain terminal of the transistor TN2. The drain terminals of the transistors TP2 and TN2 are coupled to the node N2 to which the second terminal of the resistor R12 and an output terminal of the switch circuit SW2 are coupled. A source terminal of the transistor TN2 is coupled to the GND line. A gate terminal of the transistor TP2 is coupled to an output terminal of the inverter circuit 22. An input terminal of the inverter circuit 22 is coupled to an output terminal of the inverter circuit 32, and a signal DT2 is supplied to the inverter circuit 32 from the logic circuit 50. A gate terminal of the transistor TN2 is coupled to an output terminal of the NOR circuit 42. An output signal of the inverter circuit 32 is supplied to the NOR circuit 42, and a signal DI2 is supplied to the NOR circuit 42 from the logic circuit 50.

The transistor TP2 turns on/off according to the logic level ("0" or "1") of the signal DT2. Further, the transistor TN2 turns on/off according to the logic level of the signal DT2 and the logic level ("0" or "1") of the signal DI2. In the switch circuit SW2, at least one of the transistors TP2 and TN2 is turned off in response to the signals DT2 and DI2.

The switch circuit SW3 is a tri-state buffer circuit that sets a node N3 as the H-level, the L-level or the high impedance state, similarly to the switch circuit SW0. The switch circuit SW3 includes two transistors TP3 and TN3. For example, the transistor TP3 is the P-channel MOS transistor, and the transistor TN3 is the N-channel MOS transistor. A source terminal of the transistor TP3 is coupled to the VD line. A drain terminal of the transistor TP3 is coupled to the second terminal of the resistor R13 and a drain terminal of the transistor TN3. The drain terminals of the transistors TP3 and TN3 are coupled to the node N3 to which the second terminal of the resistor R13 and an output terminal of the switch circuit SW3 are coupled. A source terminal of the transistor TN3 is coupled to the GND line. A gate terminal of the transistor TP3 is coupled to an output terminal of the inverter circuit 23. An input terminal of the inverter circuit 23 is coupled to an output terminal of the inverter circuit 33, and a signal DT3 is supplied to the inverter circuit 33 from the logic circuit 50. A gate terminal of the transistor TN3 is coupled to an output terminal of the NOR circuit 43. An output signal of the inverter circuit 33 is supplied to the NOR circuit 43, and a signal DI3 is supplied to the NOR circuit 43 from the logic circuit 50.

The transistor TP3 turns on/off according to the logic level ("0" or "1") of the signal DT3. Further, the transistor TN3 turns on/off according to the logic level of the signal DT3 and the logic level ("0" or "1") of the signal DI3. In the switch circuit SW3, at least one of the transistors TP3 and TN3 is turned off in response to the signals DT3 and DI3.

The switch circuit SW4 is a tri-state buffer circuit that sets a node N4 as the H-level, the L-level or the high impedance state, similarly to the switch circuit SW0. The switch circuit SW4 includes two transistors TP4 and TN4. For example, the transistor TP4 is the P-channel MOS transistor, and the transistor TN4 is the N-channel MOS transistor. A source terminal of the transistor TP4 is coupled to the VD line. A drain terminal of the transistor TP4 is coupled to the second terminal of the resistor R14 and a drain terminal of the transistor TN4. The drain terminals of the transistors TP4 and TN4 are coupled to the node N4 to which the second terminal of the resistor R14 and an output terminal of the switch circuit SW4 are coupled. A source terminal of the transistor TN4 is coupled to the GND line. A gate terminal of the transistor TP4 is coupled to an output terminal of the inverter circuit 24. An input terminal of the inverter circuit 24 is coupled to an output terminal of the inverter circuit 34, and a signal DT4 is supplied to the inverter circuit 34 from the logic circuit 50. A gate terminal of the transistor TN4 is coupled to an output terminal of the NOR circuit 44. An output signal of the inverter circuit 34 is supplied to the NOR circuit 44, and a signal DI4 is supplied to the NOR circuit 44 from the logic circuit 50.

The transistor TP4 turns on/off according to the logic level ("0" or "1") of the signal DT4. Further, the transistor TN4 turns on/off according to the logic level of the signal DT4 and the logic level ("0" or "1") of the signal DI4. In the switch circuit SW4, at least one of the transistors TP4 and TN4 is turned off in response to the signals DT4 and DI4.

The switch circuit SW5 is a tri-state buffer circuit that sets a node N5 as the H-level, the L-level or the high impedance state, similarly to the switch circuit SW0. The switch circuit SW5 includes two transistors TP5 and TN5. For example, the transistor TP5 is the P-channel MOS transistor, and the transistor TN5 is the N-channel MOS transistor. A source terminal of the transistor TP5 is coupled to the VD line. A drain terminal of the transistor TP5 is coupled to the second terminal of the resistor R15 and a drain terminal of the transistor TN5. The drain terminals of the transistors TP5 and TN5 are coupled to the node N5 to which the second terminal of the resistor R15 and an output terminal of the switch circuit SW5 are coupled. A source terminal of the transistor TN5 is coupled to the GND line. A gate terminal of the transistor TP5 is coupled to an output terminal of the inverter circuit 25. An input terminal of the inverter circuit 25 is coupled to an output terminal of the inverter circuit 35, and a signal DT5 is supplied to the inverter circuit 35 from the logic circuit 50. A gate terminal of the transistor TN5 is coupled to an output terminal of the NOR circuit 45. An output signal of the inverter circuit 35 is supplied to the NOR circuit 45, and a signal DI5 is supplied to the NOR circuit 45 from the logic circuit 50.

The transistor TP5 turns on/off according to the logic level ("0" or "1") of the signal DT5. Further, the transistor TN5 turns on/off according to the logic level of the signal DT5 and the logic level ("0" or "1") of the signal DI5. In the switch circuit SW5, at least one of the transistors TP5 and TN5 is turned off in response to the signals DT5 and DI5.

The switch circuit S0 includes one transistor T0. For example, the transistor T0 is the N-channel MOS transistor. A drain terminal (first terminal) of the transistor T0 is coupled to the second terminal of the resistor R20. The low voltage GND is supplied to a source terminal (second terminal) of the transistor T0. A signal DS0 is supplied from the logic circuit 50 to a gate terminal (control terminal) of the transistor T0. The transistor T0 turns on/off according to the logic level ("0 (logic L-level)" or "1 (logic H-level)") of the signal DS0. According to an on/off action of the transistor T0, a node NS0, to which the second terminal of the resistor R20 and the switch circuit S0 are coupled, is set as the L-level (low voltage GND level) or the high-impedance state. When the transistor T0 turns on in response to the H-level signal DS0, for example, the node NS0 is coupled to the GND line, and the voltage of the node NS0 is set as the L-level (low voltage GND level). For example, the node NS0 is pulled down to the low voltage GND level by the transistor T0 that is turned on. Further, when the transistor T0 turns off in response to the L-level signal DS0, the node NS0 is discoupled from the GND line and becomes the open state. Namely, when the transistor T0 turns off, the node NS0 becomes the high-impedance state.

The switch circuit S1 includes one transistor T1. For example, the transistor T1 is the N-channel MOS transistor. A drain terminal (first terminal) of the transistor T1 is coupled to the second terminal of the resistor R21 (node NS1). A source terminal (second terminal) of the transistor T1 is coupled to the GND line. A signal DS1 is supplied from the logic circuit 50 to a gate terminal (control terminal) of the transistor T1. The transistor T1 turns on/off according to the logic level ("0" or "1") of the signal DS1. According to the on/off action of the transistor T1, the node NS1, to which the second terminal of the resistor R21 and the switch circuit S1 are coupled, is set as the L-level (low voltage GND level) or the high-impedance state. When the transistor T1 turns on in response to the H-level signal DS1, for example, the node NS1 is coupled to the GND line, and the voltage of the node NS1 is set as the L-level. Namely, the node NS1 is pulled down to the low voltage GND level by the transistor T1 that is turned on. Further, when the transistor T1 turns off in response to the L-level signal DS1, the node NS1 is discoupled from the GND line and becomes the open state. When the transistor T1 turns off, the node NS1 becomes the high-impedance state.

Structures of the switch circuits S2 to S5 are the same as that of the switch circuit S1, and will be explained briefly here.

The switch circuit S2 includes one transistor T2. For example, the transistor T2 is the N-channel MOS transistor. A drain terminal (first terminal) of the transistor T2 is coupled to the second terminal of the resistor R22 (node NS2). A source terminal (second terminal) of the transistor T2 is coupled to the GND line. A signal DS2 is supplied from the logic circuit 50 to a gate terminal (control terminal) of the transistor T2. The transistor T2 turns on/off according to the logic level ("0" or "1") of the signal DS2. According to the on/off action of the transistor T2, the node NS2, to which the second terminal of the resistor R22 and the switch circuit S2 are coupled, is set as the L-level (low voltage GND level) or the high-impedance state.

The switch circuit S3 includes one transistor T3. For example, the transistor T3 is the N-channel MOS transistor. A drain terminal (first terminal) of the transistor T3 is coupled to the second terminal of the resistor R23 (node NS3). A source terminal (second terminal) of the transistor T3 is coupled to the GND line. A signal DS3 is supplied from the logic circuit 50 to a gate terminal (control terminal) of the transistor T3. The transistor T3 turns on/off according to the logic level ("0" or "1") of the signal DS3. According to the on/off action of the transistor T3, the node NS3, to which the second terminal of the resistor R23 and the switch circuit S3 are coupled, is set as the L-level (low voltage GND level) or the high-impedance state.

The switch circuit S4 includes one transistor T4. For example, the transistor T4 is the N-channel MOS transistor. A drain terminal (first terminal) of the transistor T4 is coupled to the second terminal of the resistor R24 (node NS4). A source terminal (second terminal) of the transistor T4 is coupled to the GND line. A signal DS4 is supplied from the logic circuit 50 to a gate terminal (control terminal) of the transistor T4. The transistor T4 turns on/off according to the logic level ("0" or "1") of the signal DS4. According to the on/off action of the transistor T4, the node NS4, to which the second terminal of the resistor R24 and the switch circuit S4 are coupled, is set as the L-level (low voltage GND level) or the high-impedance state.

The switch circuit S5 includes one transistor T5. For example, the transistor T5 is the N-channel MOS transistor. A drain terminal (first terminal) of the transistor T5 is coupled to the second terminal of the resistor R25 (node NS5). A source terminal (second terminal) of the transistor T5 is coupled to the GND line. A signal DS5 is supplied from the logic circuit 50 to a gate terminal (control terminal) of the transistor T5. The transistor T5 turns on/off according to the logic level ("0" or "1") of the signal DS5. According to the on/off action of the transistor T5, the node NS5, to which the second terminal of the resistor R25 and the switch circuit S5 are coupled, is set as the L-level (low voltage GND level) or the high-impedance state.

In the D/A converter 1, it is ideal that on-resistances of the transistors TP0 to TP5 and TN0 to TN5 that are contained in the switch circuits SW0 to SW5 are zero [Ω]. This is because it is ideal that terminal voltages of the resistances, to which the high voltage VD or the low voltage GND is supplied via the transistors, are equal to each other. Further, in the D/A converter 1, current amounts flowing through the resistors R0 to R5 and R10 to R15 change according to setting codes, that is, combination of the logic levels ("0 (logic L-level)" or "1 (logic H-level)") of the digital input signals D0 to D5. Therefore, when the on-resistances of the transistors TP0 to TP5 and TN0 to TN5 are higher than zero [Ω] and are equal to each other, the change in the current amounts may vary the terminal voltages of the resistors R10 to R15.

Therefore, the on-resistances of the transistors TP0 to TP5 and TN0 to TN5 are weighted according to the digital input signals D0 to D5. For example, the on-resistances of the transistors TP5 to TP0 are weighted in a binary (power of two) ratio (1:2:4:8:16:32), and the on-resistances of the transistors TN5 to TN0 are weighted in the binary ratio. Similarly, the on-resistances of the transistors T5 to T0 that are coupled in parallel with the transistors TP5 to TP0 and TN5 to TN0 are weighted in the binary ratio.

For example, as illustrated in FIG. 2A, the on-resistance of the transistor TP5 is set as a reference resistance (×1). The on-resistance of the transistor TP4 is set to be twice (×2), and the on-resistance of the transistor TP3 is set to be four times (×4) as large as the reference resistance. Similarly, the on-resistance of the transistor TP2 is set to be eight times (×8), the on-resistance of the transistor TP1 is set to be 16 times (×16), and the on-resistance of the transistor TP0 is set to be 32 times (×32) as large as the on-resistance (×1) of the transistor TP5. Meanwhile, the on-resistances of the transistors TN5 and T5 are set as a reference resistance (×1). The on-resistances of the transistors TN4 and T4 are set to be twice (×2), and the on-resistances of the transistors TN3 and T3 are set to be four times (×4) as large as the reference resistance. Similarly, the on-resistances of the transistors TN2 and T2 are set to be eight times (×8), the on-resistances of the transistors TN1 and T1 are set to be 16 times (×16), and the on-resistances of the transistors TN0 and T0 are set to be 32 times (×32) as large as the on-resistances (×1) of the transistors TN5 and T5.

Here, the transistor TP3, whose on-resistance is set to be four times, has the structure (m=2) in which two reference transistors Tp, each having a channel width Wp and a channel length Lp, as illustrated in FIG. 2D, are coupled in parallel as illustrated in FIG. 2B. In this case, a gate area of the transistor TP3 is Wp×Lp×2. Similarly, each of the transistors TN3 and T3, whose on-resistances are set to be four times, has the structure (m=2) in which two reference transistors Tn, each having a channel width Wn and a channel length Ln, as illustrated in FIG. 2E, are coupled in parallel as illustrated in FIG. 2B. In this case, the gate area of each of the transistors TN3 and T3 becomes Wn×Ln×2.

The transistor TP4, whose on-resistance is set to be twice (½ times as large as the on-resistance of the transistor TP3), uses the four reference transistors Tp (m=4) that are coupled in parallel. In this case, the gate area of the transistor TP4 becomes Wp×Lp×4. Similarly, each of the transistors TN4 and T4, whose on-resistances are set to be twice (½ times of the on-resistances of the transistors TN3 and T3), uses the four reference transistors Tn (m=4) that are coupled in parallel. In this case, the gate area of each of the transistors TN4 and T4 becomes Wn×Ln×4.

The transistor TP5, whose on-resistance is set as the reference resistance (¼ times as large as the on-resistance of the transistor TP3), uses eight reference transistors Tp (m=8) that are coupled in parallel. In this case, the gate area of the transistor TP5 becomes Wp×Lp×8. Similarly, each of the transistors TN5 and T5, whose on-resistances are set as the reference resistance (¼ times of the on-resistances of the transistors TN3 and T3), uses the eight reference transistors Tn (m=8) that are coupled in parallel. In this case, the gate area of each of the transistors TN5 and T5 becomes Wn×Ln×8.

Meanwhile, the transistor TP2, whose on-resistance is set to be eight times (twice as large as the on-resistance of the transistor TP3), has the structure (m=2 double stack) in which two groups of reference transistors Tp, each having the two reference transistors Tp coupled in series (double stack), are coupled in parallel, as illustrated in FIG. 2C. In this case, the gate area of the transistor TP2 becomes Wp×Lp×4. Similarly, each of the transistors TN2 and T2, whose on-resistances are set to be eight times (twice as large as the on-resistances of the transistors TN3 and T3), has the structure in which two groups of reference transistors Tn, each having the two reference transistors Tn coupled in series (double stack), are coupled in parallel, as illustrated in FIG. 2C. In this case, the gate area of each of the transistors TN2 and T2 becomes Wn×Ln×4.

The transistor TP1, whose on-resistance is set to be 16 times (four times as large as the on-resistance of the transistor TP3), has the structure (m=2 quadruple stack) in which two groups of reference transistors Tp, each having the four reference transistors Tp coupled in series (quadruple stack), are coupled in parallel. In this case, the gate area of the transistor TP1 becomes Wp×Lp×8. Similarly, each of the transistors TN1 and T1, whose on-resistances are set to be 16 times (four times as large as the on-resistances of the transistors TN3 and T3), has the structure (m=2 quadruple stack) in which two groups of reference transistors Tn, each having the four reference transistors Tn coupled in series (quadruple stack), are coupled in parallel. In this case, the gate area of each of the transistors TN1 and T1 becomes Wn×Ln×8.

The transistor TP0, whose on-resistance is set to be 32 times (eight times as large as the on-resistance of the transistor TP3), has the structure (m=2 octuple stack) in which two groups of reference transistors Tp, each having the eight reference transistors Tp coupled in series (octuple stack), are coupled in parallel. In this case, the gate area of the transistor TP0 becomes Wp×Lp×16. Similarly, each of the transistors TN0 and T0, whose on-resistances are set to be 32 times (eight times as large as the on-resistances of the transistors TN3 and T3), has the structure (m=2 octuple stack) in which two groups of reference transistors Tn, each having the eight reference transistors Tn coupled in series (octuple stack), are coupled in parallel. In this case, the gate area of each of the transistors TN0 and T0 becomes Wn×Ln×16.

Thus, according to this embodiment, the total gate area of the transistors TP0 to TP5 becomes Wp×Lp×42, the total gate area of the transistors TN0 to TN5 becomes Wn×Ln×42, and the total gate area of the transistors T0 to T5 becomes Wn×Ln×42.

The structures of the transistors TP0 to TP5, TN0 to TN5 and T0 to T5 may be changed as examples illustrated in FIG. 3. Only the transistors TP0 to TP5 will be explained in detail below. The transistor TP5, whose on-resistance is set as the reference resistance, may use the 64 reference transistors Tp (m=64) that are coupled in parallel. The transistor TP4, whose on-resistance is set to be twice, may use the 32 reference transistors Tp (m=32) that are coupled in parallel. The transistor TP3, whose on-resistance is set to be four times, may use the 16 reference transistors Tp (m=16) that are coupled in parallel. The transistor TP2, whose on-resistance is set to be eight times, may use the 8 reference transistors Tp (m=8) that are coupled in parallel. The transistor TP1, whose on-resistance is set to be 16 times, may use the four reference transistors Tp (m=4) that are coupled in parallel. The transistor TP0, whose on-resistance is set to be 32 times, may use the two reference transistors Tp (m=2) that are coupled in parallel. In this case, the total gate area of the transistors TP0 to TP5 becomes Wp×Lp×126. Although detailed explanations are omitted here, the transistors TN0 to TN5 and T0 to T5 may be changed similarly.

The logic circuit 50 as illustrated in FIG. 1, to which the 6-bit digital input signals D0 to D5 are inputted, generates the signals DT0 to DT5, DI0 to DI5 and DS0 to DS5 according to the combinations of the logic levels (bit values) of the digital input signals D0 to D5 (that is, the setting codes).

For example, the logic circuit 50 generates the signals DT0 to DT5, DI0 to DI5 and DS0 to DS5 that have desired signal levels, according to the setting codes, so that the nodes N0 to N5 and the nodes NS0 to NS5 have the voltages as illustrated in FIG. 5. FIG. 5 illustrates the voltages of the respective nodes N0 to N5 and NS0 to NS5, and the voltage of the analog signal Vo, when the code is increased one by one from the code="0" (that is, the setting codes (digital input signals D0 to D5) are "000000") to the code="63" (that is, the setting codes are "111111"). With regard to the voltage value of the analog signal Vo in FIG. 5, the high voltage VD is 6.4 [V] and the low voltage GND is 0 [V]. With regard to the code, the binary numbers represented by the logic levels of the digital input signals D0 to D5 are represented by the decimal notation. The letter "H" in the table means that the voltage of the corresponding node is set as the high voltage VD level, the letter "L" means that the voltage of the corresponding node is set as the low voltage GND level, and the mark "-" means that the corresponding node is set as the open state (high-impedance state).

Next, an example of an internal structure of the logic circuit 50 will be explained.

Figure 4:
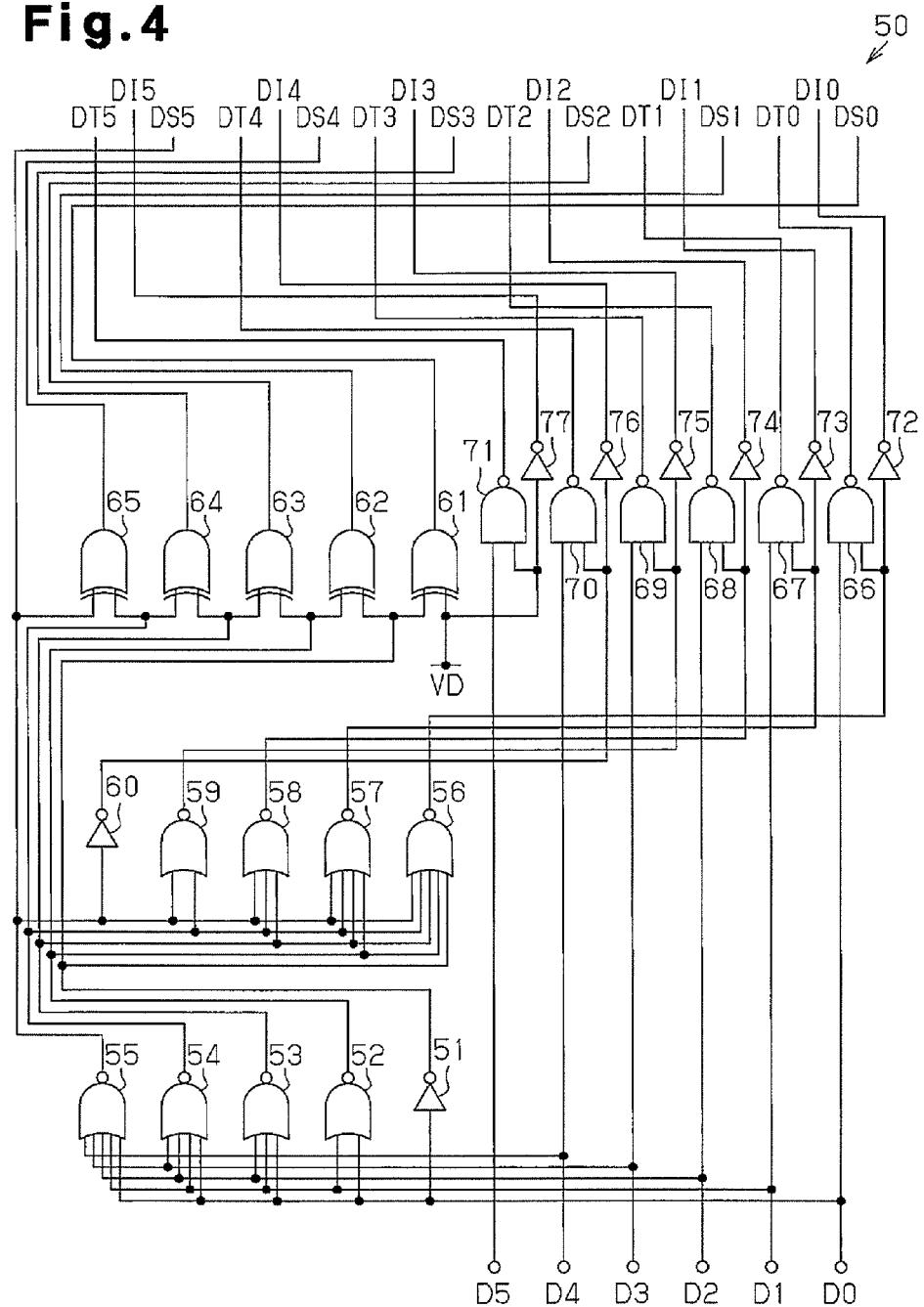
FIG. 4 is a circuit diagram of an example of an internal structure of a logic circuit.

As illustrated in FIG. 4, the logic circuit 50 includes an inverter circuit 51, NOR circuits 52 to 55, NOR circuits 56 to 59, an inverter circuit 60, exclusive OR (EXOR) circuits 61 to 65, NAND circuits 66 to 71 and inverter circuits 72 to 77.

The inverter circuit 51 outputs an output signal that is the logically-inverted digital input signal D0 to the NOR circuit 56 and the EXOR circuits 61 and 62.

The NOR circuit 52 outputs an output signal that has the result of NOR operation of the digital input signals D0 and D1 to the NOR circuits 56 and 57 and the EXOR circuits 62 and 63. The NOR circuit 53 outputs an output signal that has the result of the NOR operation of the digital input signals D0, D1 and D2 to the NOR circuits 56, 57 and 58 and the EXOR circuits 63 and 64. The NOR circuit 54 outputs an output signal that has the result of the NOR operation of the digital input signals D0, D1, D2 and D3 to the NOR circuits 56, 57, 58 and 59 and the EXOR circuits 64 and 65. The NOR circuit 55 outputs an output signal that has the result of the NOR operation of the digital input signals D0, D1, D2, D3 and D4 to the NOR circuits 56, 57, 58 and 59, the inverter circuit 60, the EXOR circuit 65, and the gate terminal of the transistor T5 in the switch circuit S5. The output signal of the NOR circuit 55 becomes the signal DS5.

The EXOR circuit 61 outputs the signal DS0 that has the result of exclusive-OR operation of the signal with the high voltage VD level and the output signal of the inverter circuit 51. The EXOR circuit 62 outputs the signal DS1 that has the result of the exclusive-OR operation of the output signal of the inverter circuit 51 and the output signal of the NOR circuit 52. The EXOR circuit 63 outputs the signal DS2 that has the result of the exclusive-OR operation of the output signal of the NOR circuit 52 and the output signal of the NOR circuit 53. The EXOR circuit 64 outputs the signal DS3 that has the result of the exclusive-OR operation of the output signal of the NOR circuit 53 and the output signal of the NOR circuit 54. The EXOR circuit 65 outputs the signal DS4 that has the result of the exclusive-OR operation of the output signal of the NOR circuit 54 and the output signal of the NOR circuit 55.

The NOR circuit 56 outputs an output signal that has the result of the NOR operation of the output signal of the inverter circuit 51 and the output signals of the NOR circuits 52 to 55 to the NAND circuit 66 and the inverter circuit 72. The NOR circuit 57 outputs an output signal that has the result of the NOR operation of the output signals of the NOR circuits 52 to 55 to the NAND circuit 67 and the inverter circuit 73. The NOR circuit 58 outputs an output signal that has the result of the NOR operation of the output signals of the NOR circuits 53 to 55 to the NAND circuit 68 and the inverter circuit 74. The NOR circuit 59 outputs an output signal that has the result of the NOR operation of the output signals of the NOR circuits 54 and 55 to the NAND circuit 69 and the inverter circuit 75. The inverter circuit 60 outputs an output signal that is the logically-inverted output signal of the NOR circuit 55 to the NAND circuit 70 and the inverter circuit 76.

The NAND circuit 66 outputs the signal DT0 that has the result of the NAND operation of the digital input signal D0 and the output signal of the NOR circuit 56. The NAND circuit 67 outputs the signal DT1 that has the result of the NAND operation of the digital input signal D1 and the output signal of the NOR circuit 57. The NAND circuit 68 outputs the signal DT2 that has the result of the NAND operation of the digital input signal D2 and the output signal of the NOR circuit 58. The NAND circuit 69 outputs the signal DT3 that has the result of the NAND operation of the digital input signal D3 and the output signal of the NOR circuit 59. The NAND circuit 70 outputs the signal DT4 that has the result of the NAND operation of the digital input signal D4 and the output signal of the inverter circuit 60. The NAND circuit 71 outputs the signal DT5 that has the result of the NAND operation of the digital input signal D5 and the signal with the high voltage VD level.

The inverter circuit 72 outputs the signal DI0 that is the logically-inverted output signal of the NOR circuit 56. The inverter circuit 73 outputs the signal DI1 that is the logically-inverted output signal of the NOR circuit 57. The inverter circuit 74 outputs the signal DI2 that is the logically-inverted output signal of the NOR circuit 58. The inverter circuit 75 outputs the signal DI3 that is the logically-inverted output signal of the NOR circuit 59. The inverter circuit 76 outputs the signal DI4 that is the logically-inverted output signal of the inverter circuit 60. The inverter circuit 77 outputs the signal DI5 that is the signal obtained by logically inverting the signal with the high voltage VD level and is fixed at the low voltage GND level (L-level).

According to this embodiment, the resistors R0 to R5 are examples of a first resistor, the resistors R10 to R15 are examples of a second resistor, the resistors R21 to R25 are examples of a third resistor, the resistor R20 is an example of a fourth resistor, and the resistor R25 is an example of a fifth resistor. The switch circuits SW0 to SW5 are examples of a first switch circuit, the switch circuits S1 to S5 are examples of a second switch circuit, the switch circuit S0 is an example of a third switch circuit, and the switch circuit S5 is an example of a fourth switch circuit. The logic circuit 50, the inverter circuits 20 to 25 and 30 to 35, and the NOR circuits 40 to 45 are examples of a control circuit, the transistors TN0 to TN5 are examples of a first transistor, the transistors TP0 to TP5 are examples of a second transistor, the reference transistor Tn is an example of a first MOS transistor, and the reference transistor Tp is an example of a second MOS transistor. The signals DT0 to DT5 and DI0 to DI5 (or the signals supplied to the gates of the transistors TP0 to TP5 and TN0 to TN5) are examples of a first signal, the signals DS1 to DS5 are examples of a second signal, the signal DS0 is an example of a third signal, the low voltage GND is an example of a first voltage, and the high voltage VD is an example of a second voltage.

Figure 19:
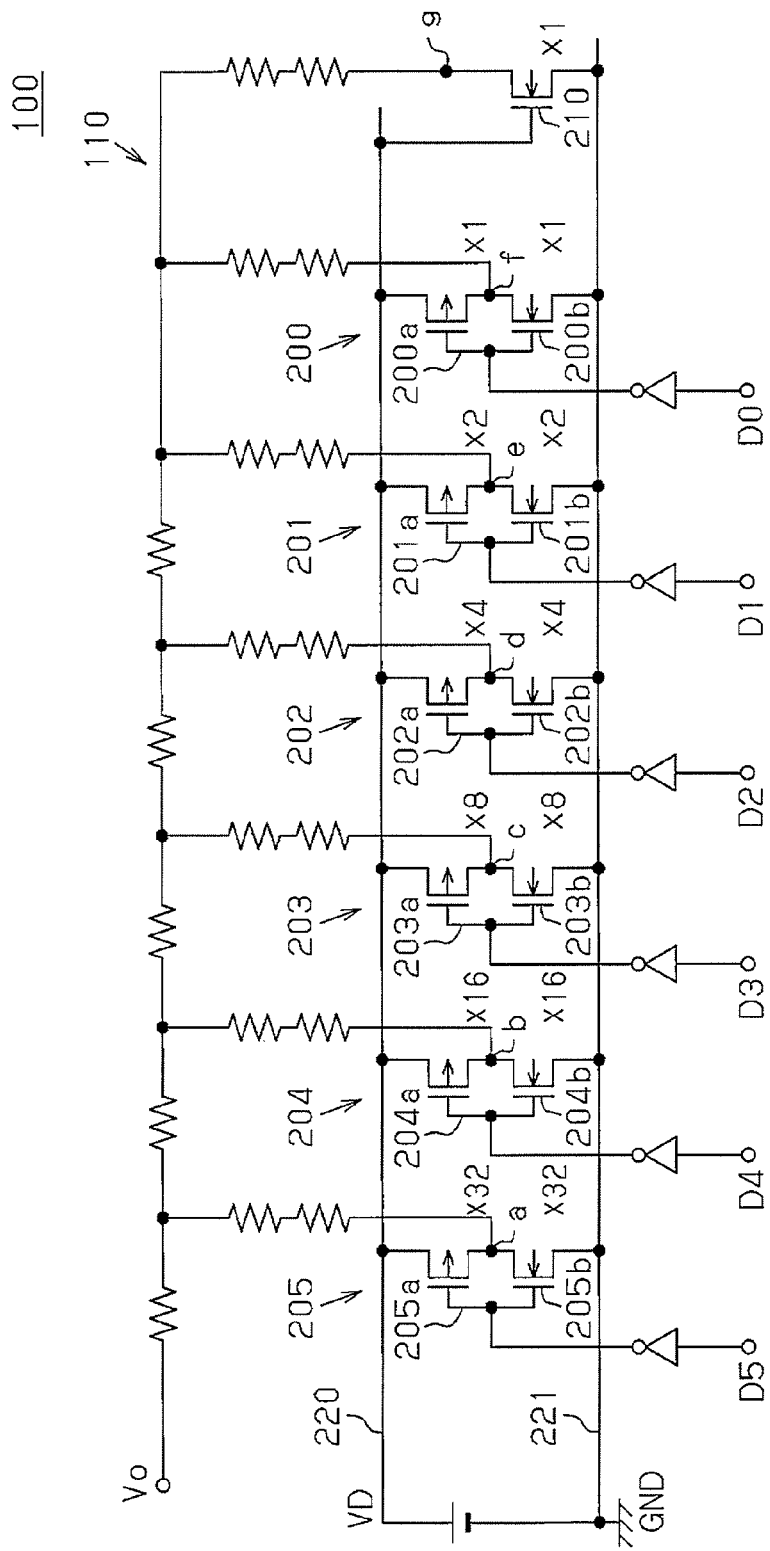
FIG. 19 is a circuit diagram of a conventional D/A converter.
Figures 20, 21:
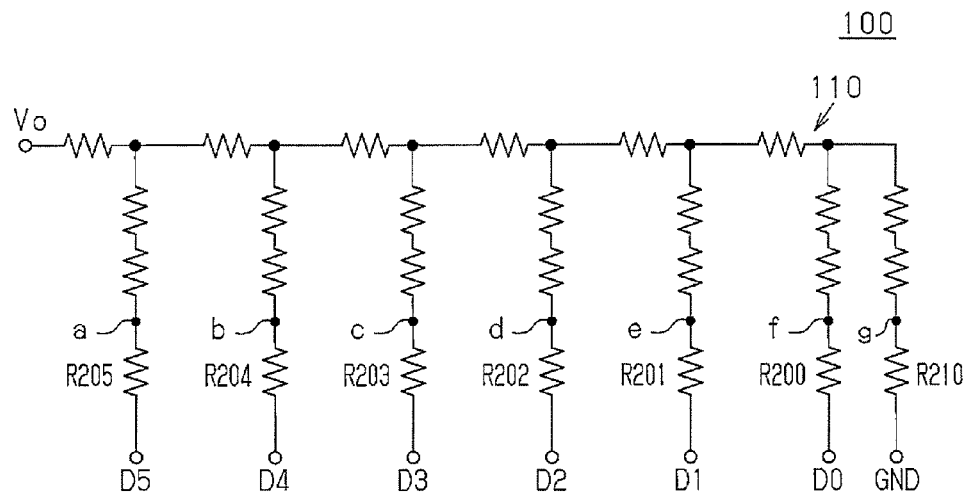
FIG. 20 is a schematic diagram explaining the operation of a conventional D/A converter.
FIG. 21 is an equivalent circuit diagram of a conventional D/A converter.
Figure 22:
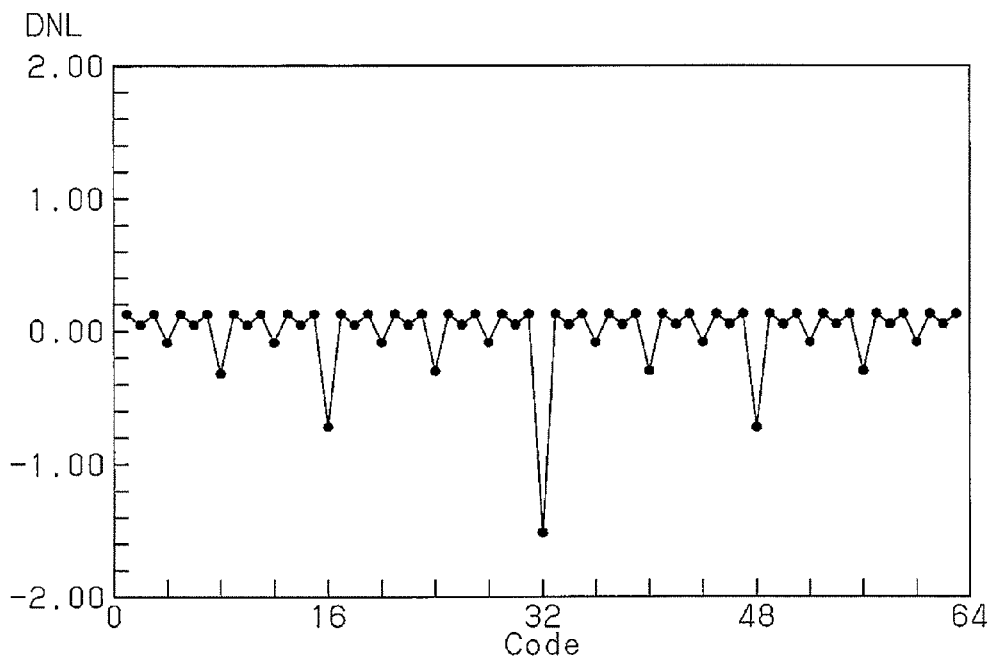
FIG. 22 is a graph of the DNL characteristics of a conventional D/A converter when the on-resistances of all the switches are identical to each other.
Figure 23:
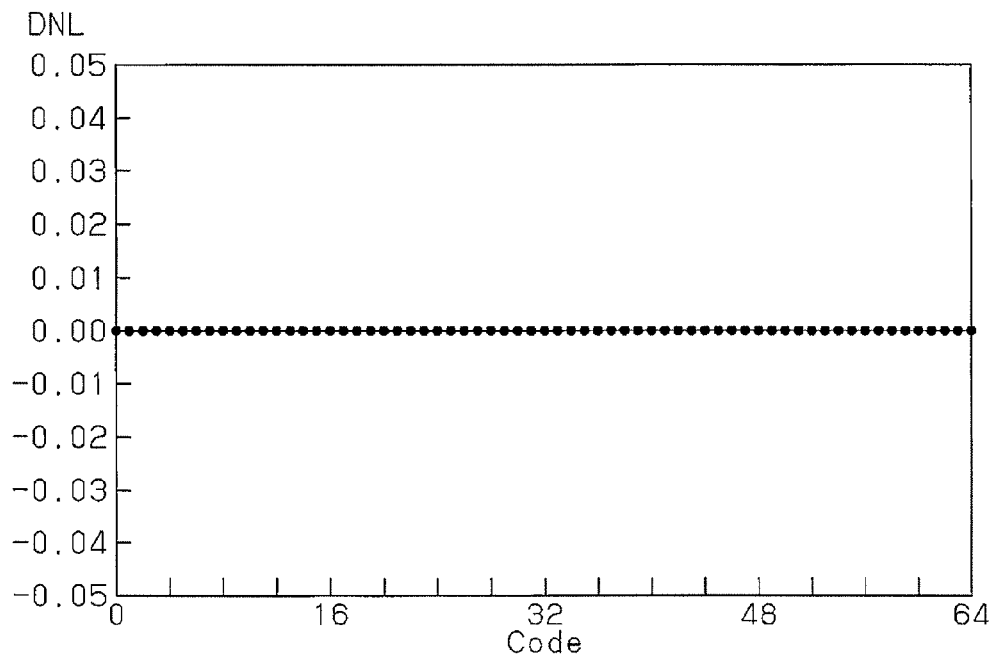
FIG. 23 is a graph of the DNL characteristics of a conventional D/A converter when the on-resistances of the switches are weighted in a binary ratio.

As described above, the variation ranges of the resistances of the on-resistances R200 to R205 are increased, and the variations in the terminal voltages of the terminals a to f are increased, when the bits are increased in the conventional R-2R type D/A converter 100 as illustrated in FIG. 19 and FIG. 21. In addition, with regard to the fluctuation widths in the terminal voltages of the terminals a to f, it is clear that the fluctuation width is greater in the terminal closer to the LSB side (the terminal f, for example), than the fluctuation width in the terminal closer to the MSB side (the terminal a, for example).

Figure 24:
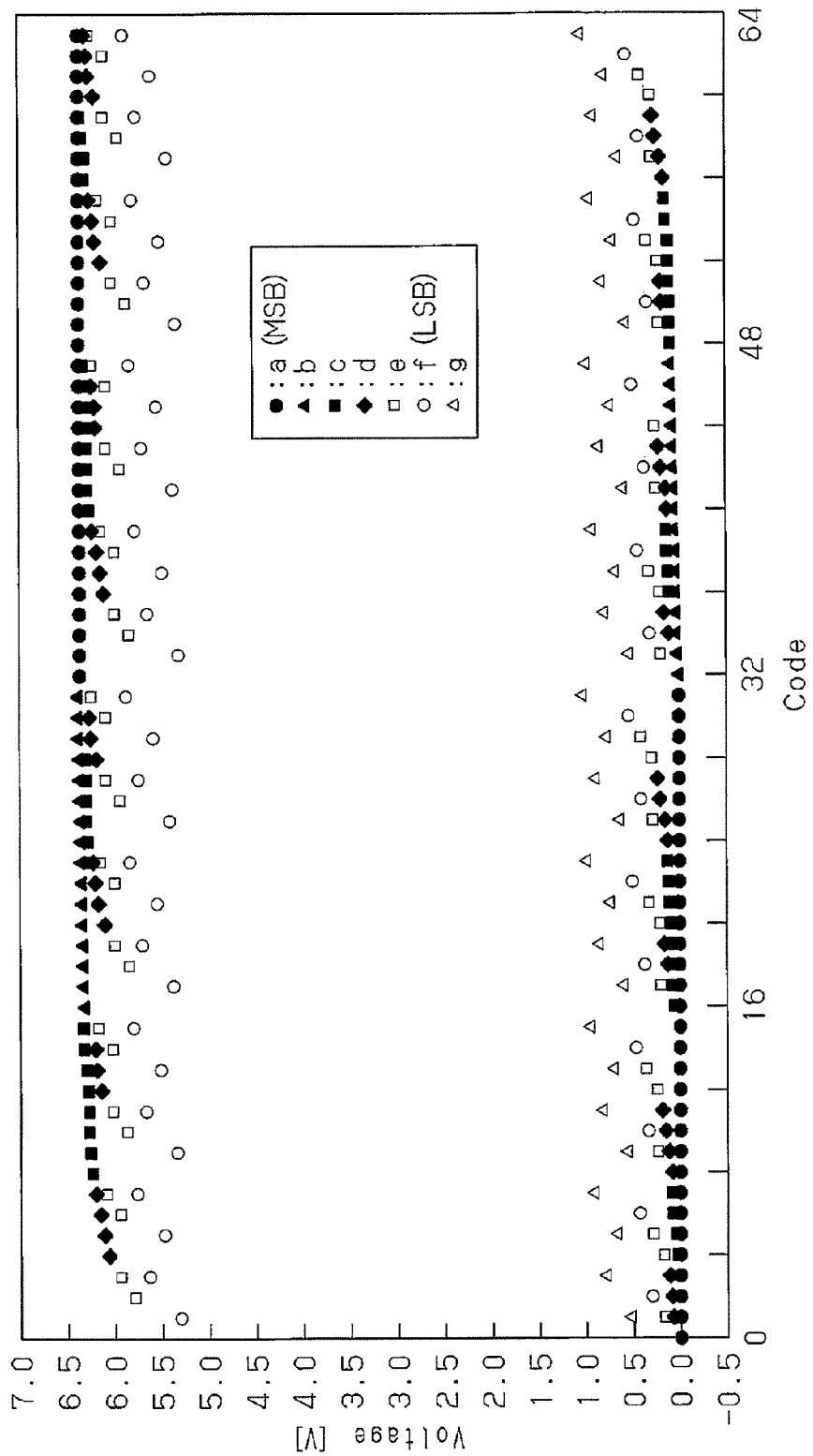
FIG. 24 is a graph explaining the relationship between codes and terminal voltages of terminals a to g.

FIG. 24 illustrates the terminal voltages of the terminals a to g plotted for the respective codes, when the resistances of the on-resistances R205 to R200, as illustrated in FIG. 21, are weighted in the binary ratio, and when the code is increased one by one from "0" to "64". At this time, the high voltage VD is 6.4 [V] and the low voltage GND is 0.0 [V], and therefore, it is ideal that each of the terminal voltages of the terminals a to g has the voltage value of 6.4 [V] or 0.0 [V]. This means that the fluctuation widths in the terminal voltages of the terminals a to g are greater as the terminal voltages of the terminals a to g are deviated from 6.4 [V] or 0.0 [V].

As is clear from the result in FIG. 24, the terminal voltages of the terminals on the MSB side (the terminals a to c, for example) are plotted at the positions (voltage values) closer to 6.4 [V] or 0.0 [V]. On the other hand, the terminal voltages are plotted at the positions (voltage values) separated from 6.4 [V] or 0.0 [V] as the terminals approach the LSB side (terminals d→e→f→g). In other words, the fluctuation widths of the terminal voltages of the terminals a to g increase from the MSB side to the LSB side. The reasons for this will be examined. As described above, the resistances of the on-resistances R205 to R200 of the switches 205 to 200 (transistors 205a to 200a and 205b to 200b) are weighted in the binary ratio from the MSB side to the LSB side, in the R-2R type D/A converter 100. At this time, the on-resistances of the MOS transistors 205a to 200a and 205b to 200b vary according to the applied voltage values. Therefore, the transistors on the LSB side, whose set resistances of the on-resistances R205 to R200 are larger, have the large fluctuation widths in the voltages generated in the drain terminals of themselves, as the on-resistances of themselves are large. As a result of this, the variation ranges (fluctuation ranges) of the resistances of the on-resistances R205 to R200 are increased from the MSB side to the LSB side.

From the above, it is clear that the variation ranges (fluctuation ranges) of the terminal voltages of the terminals a to g are increased, as the bits are increased in the R-2R type D/A converter 100. In addition, the increase in the variation ranges of the terminal voltages of the terminals a to g increases the variation ranges (fluctuation ranges) of the on-resistances R205 to R200, which causes such a problem that D/A conversion accuracy of the R-2R type D/A converter 100 is deteriorated.

For this reason, with the D/A converter 1 according to this embodiment, the transistors with the small on-resistances (the transistors on the MSB side) are turned on wherever possible, and the transistors with the large on-resistances (the transistors on the LSB side) are not turned on wherever possible, to the extent necessary to output the analog signal Vo with the desired voltage value according to the setting codes. For example, the logic circuit 50 of the D/A converter 1 generates the signals DT0 to DT5 and DI0 to DI5 so that the nodes N0 to N5 on the LSB side become the open state, wherever possible, according to the setting codes.

As illustrated in FIG. 5, when "0" is repeated for one or more times from the digital input signal D0 as the LSB toward the digital input signal D5 side as the MSB, the nodes corresponding to the digital input signals of the repeated "0" are set as the open state, according to this embodiment. Hereinafter, a detailed explanation will be made on the relationship between the codes and the voltages of the nodes N0 to N5 and NS0 to NS5 that are set in the logic circuit 50 according to the codes.

First, when the code is "0" (setting codes=000000), all the digits from the LSB to the MSB are "0" ("0" is repeated for six times from the LSB). In this case, the node N5 corresponding to the digital input signal D5 as the MSB is set as the L-level, and the node NS5 of the switch circuit S5 corresponding to the MSB is set as the L-level. Then, all the nodes N0 to N4 and NS0 to NS4 that are on the LSB side from the node NS5 that is set as the L-level are set as the open state. For example, when the code is "0", the logic circuit 50 generates the H-level signal DT5, the L-level signal DI5, and the H-level signal DS5, according to the setting codes=000000. In response to the H-level signal DT5 and the L-level signal DI5, the transistor TP5 turns off and the transistor TN5 turns on, and at the same time, the transistor T5 turns on in response to the H-level signal DS5. Thereby, the node N5 is coupled to the GND line and the node NS5 is coupled to the GND, and therefore, the voltages of the nodes N5 and NS5 are set as the L-level (low voltage GND level). Meanwhile, the logic circuit 50 generates the H-level signals DT0 to DT4, the H-level signals DI0 to DI4, and the L-level signals DS0 to DS4, according to the setting codes=000000. In response to the H-level signals DT0 to DT4 and the H-level signals DI0 to DI4, the transistors TP0 to TP4 and the transistors TN0 to TN4 turn off. Thereby, the nodes N0 to N4 become the open state. Further, in response to the L-level signals DS0 to DS4, the transistors T0 to T4 turn off. Thereby, the nodes NS0 to NS4 become the open state. Under such a voltage state (connection state), the analog signal Vo becomes 0.0 [V] corresponding to the code "0", since none of the nodes N0 to N5 and NS0 to NS5 is coupled to the line, other than the GND line.

Next, when the code is "1" (setting codes=000001), "0" is not repeated for one or more times from the LSB. In this case, only the node N0 that corresponds to the digital input signal D0 as "1" is set as the H-level, and the nodes N1 to N5 corresponding to the digital input signals D1 to D5 as "0" are set as the L-level. Further, the node NS0 is set as the L-level, and the nodes NS1 to NS5 are set as the open state. Thus, according to the code in which "0" is not repeated for one or more times from the LSB, the voltage state (connection state) is set similarly to that of the conventional D/A converter 100 to which the setting codes=000001 are inputted. For example, according to the code in which "0" is not repeated for one or more times from the LSB, the nodes N0 to N5 are respectively coupled to the GND line or the VD line, corresponding to the digital input signals D0 to D5. Further, the node NS0 of the switch circuit S0 corresponding to the LSB is coupled to the GND line, and the nodes NS1 to NS5 of other switch circuits S1 to S5 are set as the open state.

For example, in response to the digital input signal D0 (LSB) that is always "1" according to the code in which "0" is not repeated for one or more times from the LSB, the logic circuit 50 outputs the L-level signal DS0 and the H-level signals DS1 to DS5. The transistor T0 is turned on in response to the L-level signal DS0, and the transistors T1 to T5 are turned off in response to the H-level signals DS1 to DS5. Thereby, the node NS0 is coupled to the GND line, the voltage of the node NS0 is set as the L-level (low voltage GND level), and the nodes NS1 to NS5 are set as the open state.

Further, in response to the digital input signal D0 as "1", the logic circuit 50 generates the signals DT0, DT1, DT2, DT3, DT4 and DT5 having the logic levels obtained by logically inverting the logic levels of the digital input signal D0, D1, D2, D3, D4 and D5, and generates the L-level signals DI0 to DI5. Thereby, when the digital input signals D1 to D5 are "0", the H-level signals are supplied to the transistors TP1 to TP5 and TN1 to TN5, and when the digital input signals D0 to D5 are "1", the L-level signals are supplied to the transistors TP0 to TP5 and TN0 to TN5.

In this embodiment, the L-level signal DT0 and the L-level signal DI0 are generated in the logic circuit 50 in response to the digital input signal D0 as "1", and the transistor TP0 is turned on and the transistor TN0 is turned off in response to the L-level signals DT0 and DI0. Thereby, the node N0 is coupled to the VD line, and the node N0 is set as the H-level (high voltage VD level). Further, the H-level signals DT1 to DT5 and the L-level signals DI1 to DI5 are generated in the logic circuit 50 in response to the digital input signals D1 to D5 as "0", and the transistors TP1 to TP5 are turned off and the transistors TN1 to TN5 are turned on in response to the signals DT1 to DT5 and DI1 to DI5. Thereby, the nodes N1 to N5 are coupled to the GND line, and the nodes N1 to N5 are set as the L-level (low voltage GND level).

Under the connection state like this, the analog signal Vo becomes 0.1 [V] corresponding to the code "1".

Next, when the code is "2" (setting codes=000010), "0" appears once from the LSB. In this case, the node NS1, corresponding to the digital input signal D1 that becomes "1" for the first time after "0" is repeated for one or more times from the LSB is set as the L-level, and the nodes N0 and NS0 that are provided on the LSB side from the node NS1 are set as the open state. Further, the node N1 corresponding to the digital input signal D1 as "1" is set as the H-level, and the nodes N2 to N5 corresponding to the digital input signals D2 to D5 as "0" are set as the L-level. Then, the nodes NS2 to NS5, except for the node NS1 that is set as the L-level, are set as the open state. In other words, the voltage state (connection state) on the MSB side (upper bit side) from the digital input signal D1 that becomes "1" for the first time after "0" is repeated for one or more times from the LSB is set similarly to that of the conventional D/A converter 100 to which the digital input signals D1 to D5=00001 are inputted. Under the connection state as described above, the nodes N2 to N5 corresponding to the digital input signals D2 to D5 as "0" are coupled to the GND line, the node N1 corresponding to the digital input signal D1 as "1" is coupled to the VD line, and none of the nodes NS1, N0 and NS0 that are on the LSB side from the node N1 is coupled to the line, other than the GND line. Thus, the impedance seen from the output terminal of the D/A converter 1 is identical to the impedance of when the digital input signals D0 to D5=000010 are inputted to the conventional D/A converter 100. Meanwhile, the transistors TN0 and T0, corresponding to the digital input signal D0 (LSB) as "0", are not turned on, the nodes N0 and NS0 are set as the open state, and the switch circuit S1 (transistor T1) corresponding to the digital input signal D1 that is a bit higher is turned on. Thus, the transistors TN0 and T0 that are on the LSB side and that have the greater on-resistances are not turned on, and the transistor T1 that is on the MSB side and that has the smaller on-resistance and variations is turned on. Thereby, the variations in the on-resistances may be reduced as a whole, and the reduction in the D/A conversion accuracy due to the variations may be suppressed. Therefore, the analog signal Vo of 0.2 [V] corresponding to the code "2" may be generated with high accuracy.

Next, when the code is "3" (setting codes=000011), "0" is not repeated for one or more times from the LSB. In this case, only the node N0 corresponding to the digital input signal D0 as "1" is set as the H-level, and the nodes N1 to N5 corresponding to the digital input signals D1 to D5 as "0" are set as the L-level. Further, the node NS0 is set as the L-level, and the nodes NS1 to NS5 are set as the open state. In other words, the voltage state (connection state) is set similarly to that of the conventional D/A converter to which the setting codes=000011 are inputted, similarly to the case of the code "1". Under the connection state like this, the analog signal Vo becomes 0.3 [V] corresponding to the code "3".

Next, when the code is "4" (setting codes=000100), "0" is repeated twice from the LSB. In this case, the node NS2 of the switch circuit S2, corresponding to the digital input signal D2 that becomes "1" for the first time after "0" is repeated from the LSB, is set as the L-level, and all the nodes N1, NS1, N0 and NS0, provided on the LSB side from the node NS2, are set as the open state. Further, the node N2 corresponding to the digital input signal D2 as "1" is set as the H-level, and the nodes N3 to N5 corresponding to the digital input signals D3 to D5 as "0" are set as the L-level. Then, the nodes NS3 to NS5, except for the node NS2 that is set as the L-level, are set as the open state. In other words, the voltage state (connection state) on the MSB side (upper bit side) from the digital input signal D2 that becomes "1" for the first time after "0" is repeated from the LSB is set similarly to that of the conventional D/A converter 100 to which the digital input signals D2 to D5=0001 are inputted. Under the connection state as described above, the nodes N3 to N5 corresponding to the digital input signals D3 to D5 as "0" are coupled to the GND line, the node N2 corresponding to the digital input signal D2 as "1" is coupled to the VD line, and none of the nodes NS2, N1, NS1, N0 and NS0 that are on the LSB side from the node N2 is coupled to the line, other than the GND line. Thus, the impedance seen from the output terminal of the D/A converter 1 is identical to the impedance of when the digital input signals D0 to D5=000010 are inputted to the conventional D/A converter 100. Meanwhile, the transistors TN0, TP0, T0, TN1, TP1 and T1, corresponding to the digital input signals D0 and D1 as "0", are not turned on, the nodes N0, NS0, N1 and NS1 are set as the open state, and the switch circuit S2 (transistor T2) corresponding to the digital input signal D2 that is a bit higher is turned on. Thus, the transistors TN0, T0, TN1 and T1 that are on the LSB side and that have the greater on-resistances are not turned on, and the transistor T2 that is on the MSB side and that has the smaller on-resistance and variations is turned on. Thereby, the variations in the on-resistances may be reduced as a whole, and the reduction in the D/A conversion accuracy due to the variations may be suppressed. Therefore, the analog signal Vo of 0.2 [V] corresponding to the code "2" may be generated with high accuracy.

According to the code in which "0" is repeated for one or more times from the LSB, as described above, either one of the nodes NS1 to NS5, corresponding to the digital input signal that becomes "1" for the first time after "0" is repeated from the LSB, is set as the L-level, and all the nodes, provided on the LSB side from the node that is set as the L-level, are set as the open state (refer to broken-line frames in FIG. 5). The voltage state (connection state) on the MSB side (upper bit side) from the digital input signal that becomes "1" for the first time is set similarly to that of the conventional D/A converter 100. At this time, only one transistor is turned on out of the transistors T0 to T5 of the switch circuits S0 to S5. Thus, when "0" is repeated for one or more times from the LSB, the nodes that are on the LSB side and that correspond to the digital input signals as "0" are set as the open state, so that the transistors on the LSB side with the large on-resistances are not turned on wherever possible.

Similarly, according to the subsequent codes, the voltages of the nodes N0 to N5 and NS0 to NS5 are set according to the setting codes (digital input signals D0 to D5), as illustrated in FIG. 5.

Hereinafter, an explanation will be given to the effect of setting the nodes on the LSB side as the open state wherever possible, according to the code in which "0" is repeated for one or more times from the LSB.

First, the problem of the conventional D/A converter 100 will be explained. As described above, in the R-2R type D/A converter 100, the resistances of the on-resistances R205 to R200 of the switches 205 to 200 (transistors 205a to 200a and 205b to 200b) are weighted in the binary ratio from the MSB side to the LSB side. As the on-resistances of the transistors 205a to 200a and 205b to 200b vary according to the applied voltage values, the transistors on the LSB side, whose set resistances of the on-resistances R205 to R200 are larger, have the large fluctuation widths in the voltages generated in the drain terminals of themselves, since the on-resistances of themselves are large. As a result of this, the variation ranges (fluctuation ranges) of the resistances of the on-resistances R205 to R200 are increased from the MSB side to the LSB side. When the variations in the on-resistances of the transistors 205a to 200a and 205b to 200b are increased like this, a binary weighting ratio between the bits is deteriorated significantly.

Figure 7A:
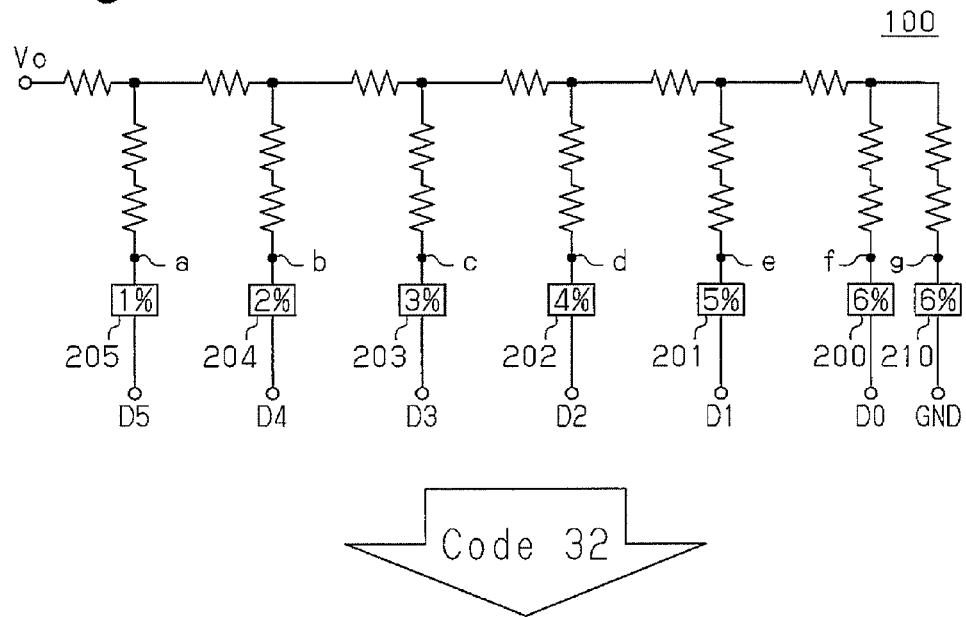
FIGS. 7A and 7B are schematic diagrams explaining a problem of a conventional D/A converter.

FIG. 7A illustrates an example of the conventional D/A converter in which the variation ranges of the on-resistances of the switches 205 to 200 and 210 that are weighted in the binary ratio are increased from the MSB side to the LSB side. In FIG. 7A, a numerical value in each of the switches 205 to 200 and 210 indicates the percentage of the variation range of the on-resistance from the set resistance.

Figure 7B:
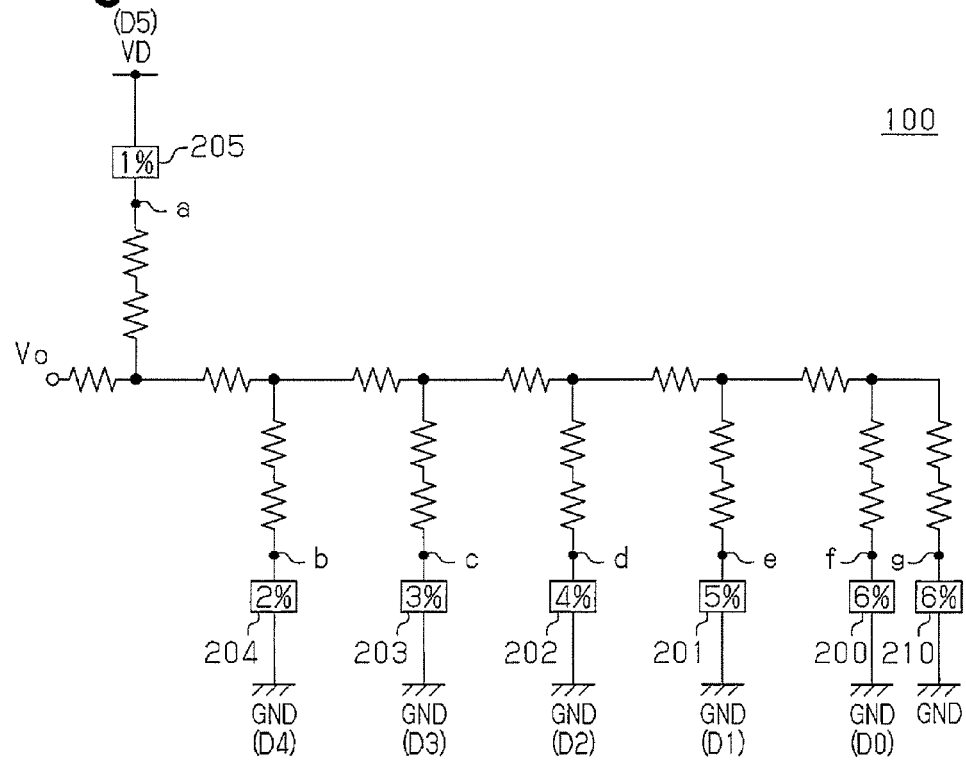

When the digital input signals D0 to D5=100000 according to the code "32" is inputted to the D/A converter 100 as illustrated in FIG. 7A, for example, only the node a is coupled to the VD line and the nodes b to g are coupled to the GND line, as illustrated in FIG. 7B. At this time, the variations of 2%, 3%, 4%, 5%, 6% and 6% in the switches 204 to 200 and 210 are synthesized on the GND line side. This causes such problems that the variation ranges of the on-resistances of the switches 204 to 200 and 210 on the GND line side are increased, and the D/A conversion accuracy is deteriorated.

Figure 6A:
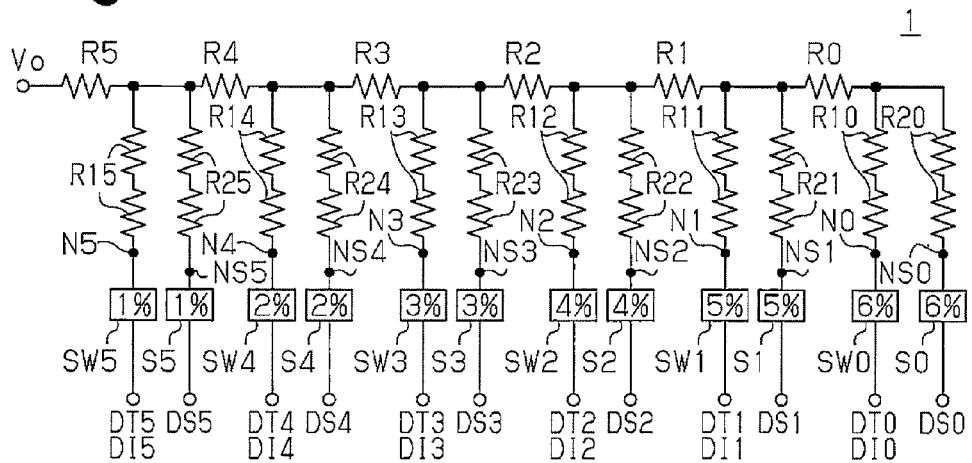
FIGS. 6A and 6B are schematic diagrams explaining the action of the D/A converter according to the embodiment.

Meanwhile, FIG. 6A illustrates an example of the D/A converter 1 according to this embodiment, in which the variation ranges of the on-resistances of the switch circuits SW5 to SW0 and S5 to S0 are increased from the MSB side to the LSB side. In FIG. 6A, a numerical value in each of the switch circuits SW0 to SW5 and S0 to S5 indicates the percentage of the variation range of the on-resistance from the set resistance of each of the transistors TP0 to TP5, TN0 to TN5, and T0 to T5.

Figure 6B:
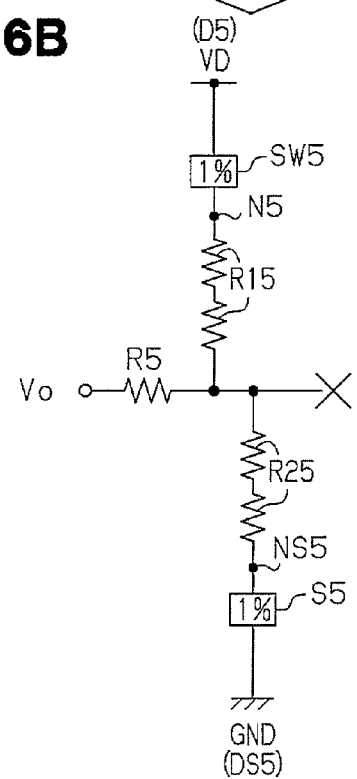

When the digital input signals D0 to D5=100000 according to the code "32" are inputted to the D/A converter 1 as illustrated in FIG. 6A, the node NS5 of the switch circuit S5, corresponding to the digital input signal D5 that becomes "1" for the first time after "0" is repeated from the LSB, is set as the L-level, as illustrated in FIG. 6B. Further, the node N5 corresponding to the digital input signal D5 as "1" is set as the H-level. Then, all the nodes N0 to N4 and NS0 to NS4, provided on the LSB side from the node NS5 that is set as the L-level, are set as the open state. Thereby, as illustrated in FIG. 6B, only the node N5 is coupled to the VD line, and only the node NS5 is coupled to the GND line. Thus, only the switch circuit S5 that is on the MSB side and that has small variations in the on-resistance (1% in this case) is coupled to the GND line. Therefore, contrary to the conventional D/A converter 100 in which the 2% to 6% variations are synthesized on the GND line side, only the transistors (transistors TP5 and T5 in this case) having the small variation ranges and the small on-resistances pass the current, so as to generate the analog signal Vo. As a result of this, it is possible to generate the analog signal Vo with more excellent D/A conversion accuracy, as compared with the conventional D/A converter 100 in which the 2% to 6% variations are synthesized on the GND line side. Therefore, the analog signal Vo of 12 [V] corresponding to the code "32" may be generated with higher accuracy.

Next, the relationship between the variations caused in the on-resistances of the switch circuits SW0 to SW5 and S0 to S5 and DNL characteristics will be explained with reference to FIGS. 8 to FIG. 11.

Figure 8A:
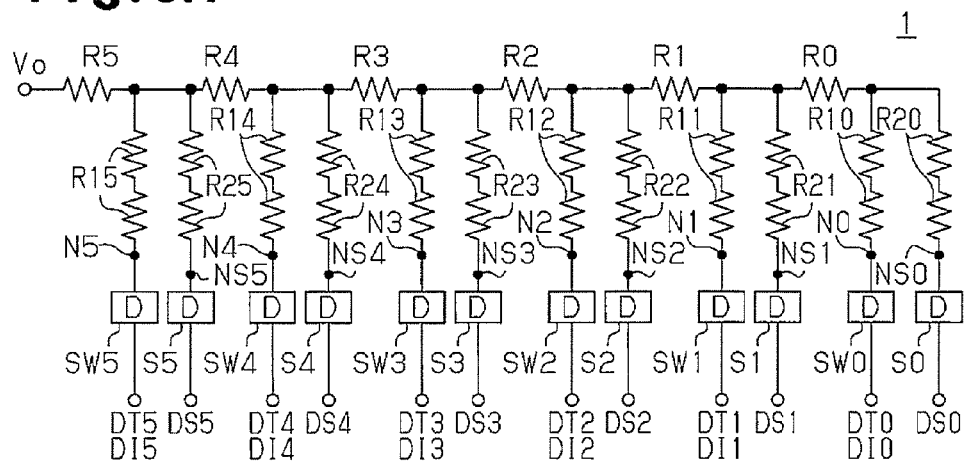
FIG. 8A is a circuit diagram of the D/A converter in which large variations are caused in on-resistances of the switches.
Figure 9A:
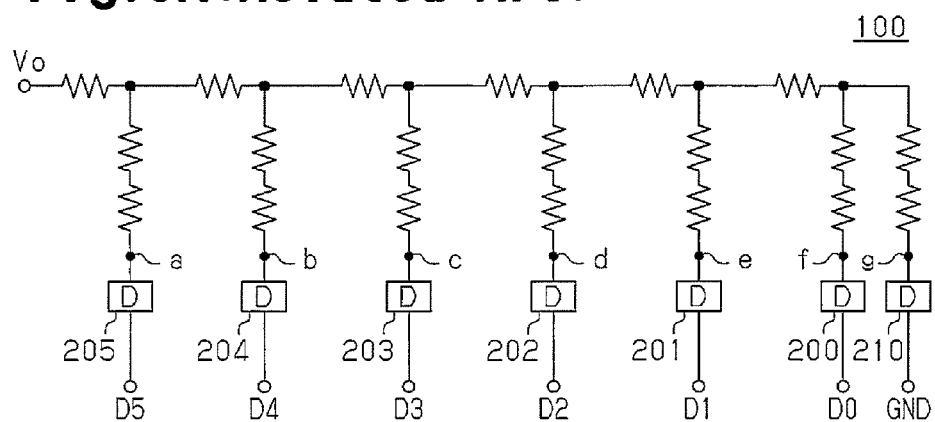
FIG. 9A is a circuit diagram of a conventional D/A converter in which large variations are caused in the on-resistances of the switches.

FIG. 8A illustrates the D/A converter 1 according to this embodiment in which the large variations are caused in the on-resistances of the switch circuits SW5 to SW0 and S5 to S0. For example, all the on-resistances of the switch circuits SW5 to SW0 and S5 to S0 are the resistance of "D" as illustrated in FIG. 2, that is, the resistance eight times as large as the reference resistances of the transistors TP5, TN5 and T5. Thus, the on-resistances of the switch circuits SW5 to SW0 and the switch circuits S5 to S0 are not weighted in the binary ratio, and the variations in the on-resistances are increased. FIG. 9A illustrates the conventional D/A converter 100 in which the large variations are caused in the on-resistances of the switches 205 to 200 and 210, similarly to the D/A converter 1 as illustrated in FIG. 8A. For example, all the on-resistances of the switches 205 to 200 and 210 are the resistance of "D" as illustrated in FIG. 2.

Figure 8B:
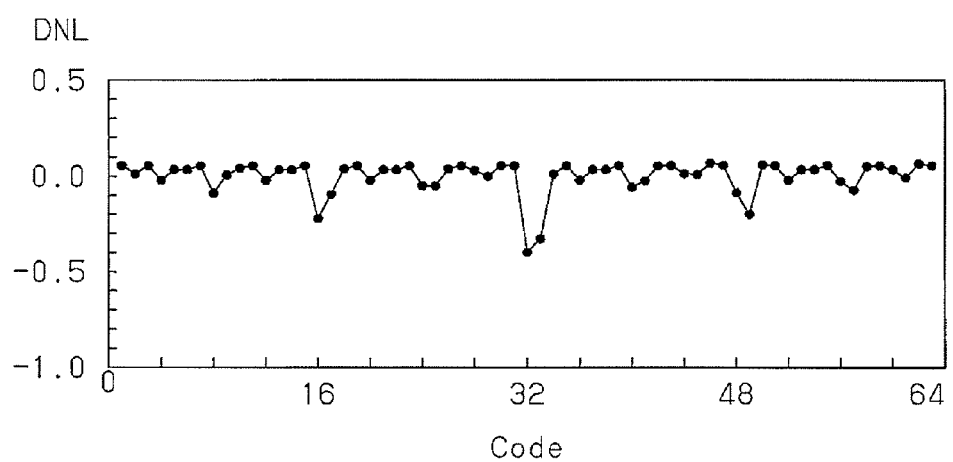
FIG. 8B is a graph of DNL characteristics of the D/A converter.
Figure 9B:
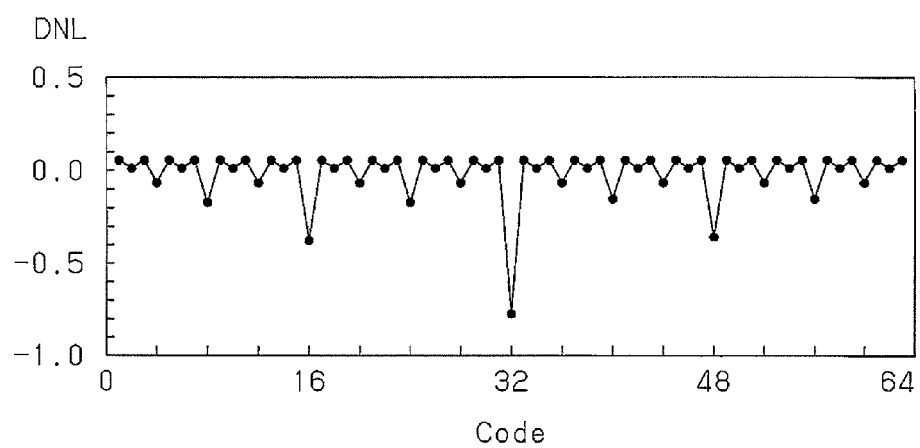
FIG. 9B is a graph of the DNL characteristics of the D/A converter of FIG. 9A.

FIG. 8B illustrates a DNL waveform of the D/A converter 1 as illustrated in FIG. 8A, and FIG. 9B illustrates a DNL waveform of the D/A converter 100 as illustrated in FIG. 9A. These DNL waveforms illustrate the size of the DNL (vertical axis) relative to the respective codes (horizontal axis).

As illustrated by the DNL waveform in FIG. 9B, large peak waveforms appear every four codes (codes=4, 8, 12, 16, 20, 24, 28, 32, 36, 40, 44, 48, 52, 56 and 60), according to the D/A converter 100 as illustrated in FIG. 9A. For example, the large peak waveforms appear every 16 codes (codes 16, 32 and 48), according to the D/A converter 100. Meanwhile, with the D/A converter 1 according to this embodiment that sets the nodes on the LSB side as the open state wherever possible, peak values of the peak waveforms that appear every four codes are smaller, according to the code in which "0" is repeated for one or more times from the LSB, as illustrated in FIG. 8B. For example, with the D/A converter 1, the peak values of the peak waveforms that appear every 16 codes are substantially smaller than those of the conventional D/A converter 100. This is because the codes, with which the peak waveforms appear, are the codes in which "0" is repeated for two or more times from the LSB, and, according to the codes, the variations in the on-resistances on the GND line side are reduced by setting the nodes on the LSB side as the open state wherever possible. As the peak values of the peak waveforms are smaller, as described above, a fluctuation width (Peak to Peak) of the DNL is smaller with the D/A converter 1 according to this embodiment, as compared with the conventional D/A converter 100. The DNL characteristics are substantially improved by the D/A converter 1 by setting the nodes on the LSB side as the open state wherever possible, as compared with the conventional D/A converter 100.

Figure 10A:
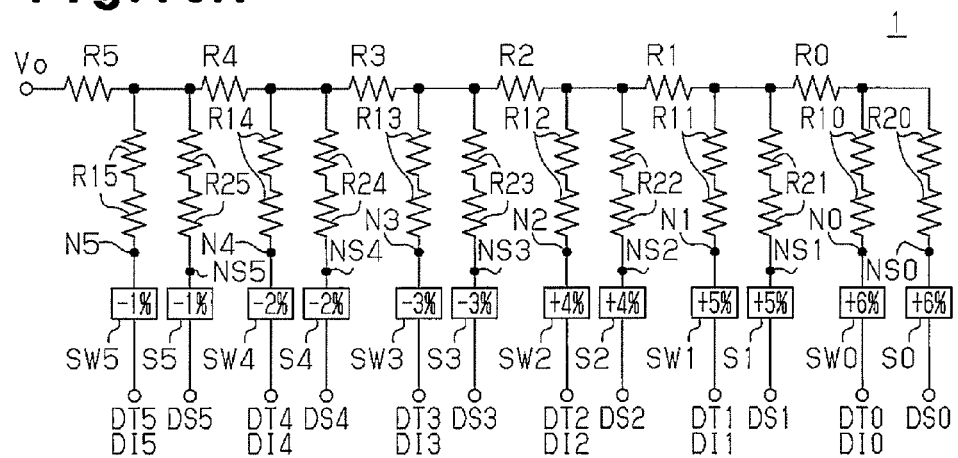
FIG. 10A is a circuit diagram of the D/A converter in which large variations are caused in the on-resistances of the switches.
Figure 11A:
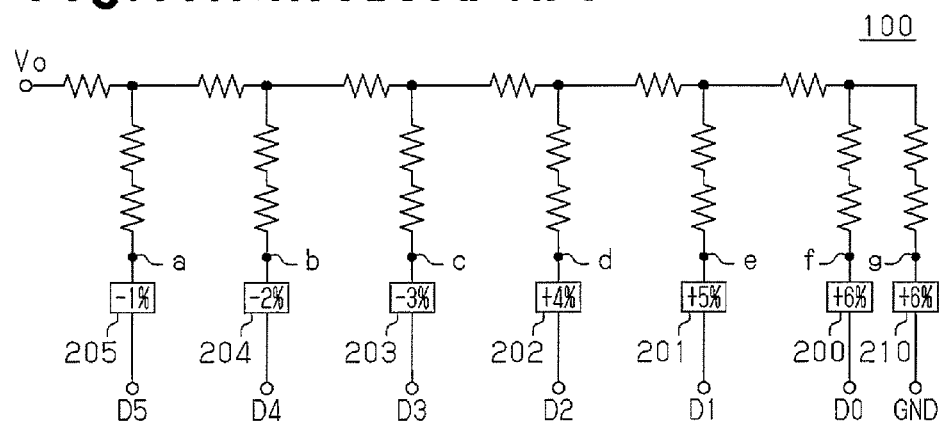
FIG. 11A is a circuit diagram of a conventional D/A converter in which large variations are caused in the on-resistances of the switches.

FIG. 10A illustrates the D/A converter 1 according to this embodiment in which the large variations are caused in the on-resistances of the switch circuits SW5 to SW0 and S5 to S0. For example, in FIG. 10A, the variation ranges from the set resistances of the on-resistances of the switch circuits SW5, SW4, SW3, SW2, SW1 and SW0 are −1%, −2%, −3%, +4%, +5% and +6%, respectively. Similarly, the variation ranges from the set resistances of the on-resistances of the switch circuits S5, S4, S3, S2, S1 and S0 are −1%, −2%, −3%, +4%, +5% and +6%, respectively. In FIG. 10A, the on-resistances of the switch circuits SW5 to SW0 and S5 to S0 have the variations in both of a minus (−) direction and a plus (+) direction. FIG. 11A illustrates the conventional D/A converter 100 in which the large variations are caused in the on-resistances of the switches 205 to 200, similarly to the D/A converter 1 as illustrated in FIG. 10A. For example, the variation ranges of the on-resistances of the switches 205, 204, 203, 202, 201 and 200 that are weighted in the binary ratio are −1%, −2%, −3%, +4%, +5% and +6%, respectively.

Figure 10B:
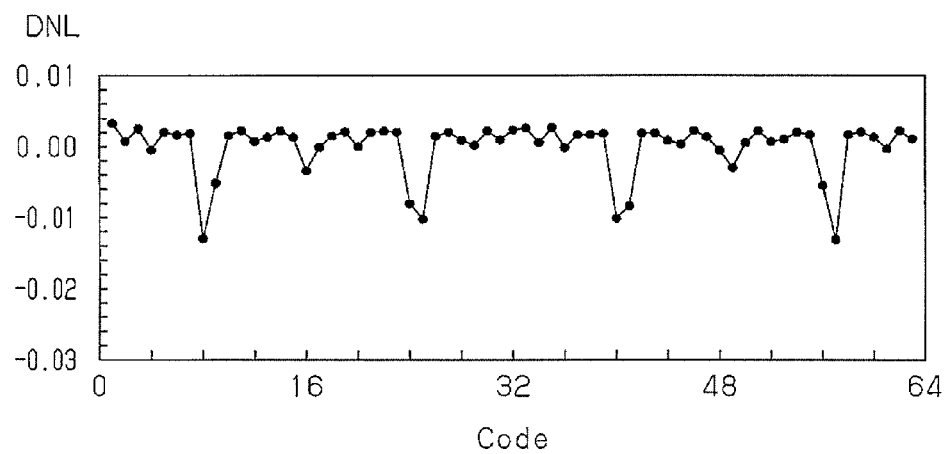
FIG. 10B is a graph of the DNL characteristics of the D/A converter of FIG. 10A.
Figure 11B:
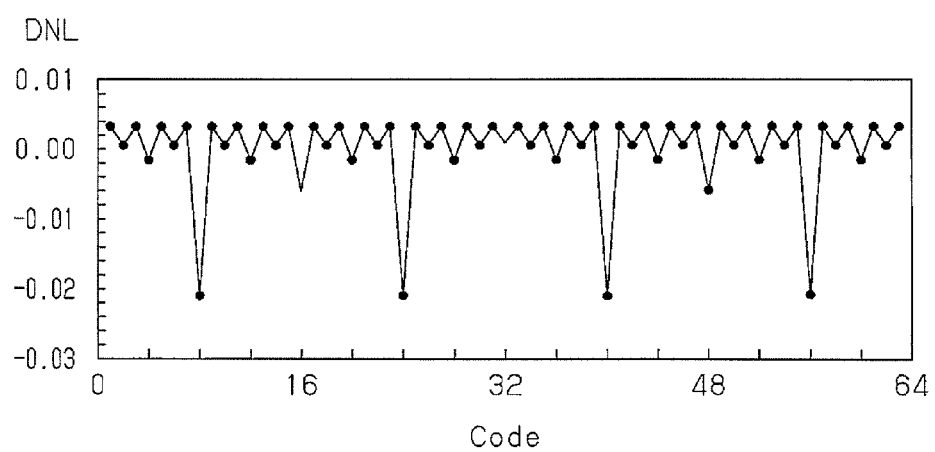
FIG. 11B is a graph of the DNL characteristics of the D/A converter of FIG. 11A.

FIG. 10B illustrates a DNL waveform of the D/A converter 1 as illustrated in FIG. 10A, and FIG. 11B illustrates a DNL waveform of the D/A converter 100 as illustrated in FIG. 11A.

As illustrated by the DNL waveform in FIG. 11B, large peak waveforms appear every four codes (codes=4, 8, 12, 16, 20, 24, 28, 32, 36, 40, 44, 48, 52, 56 and 60), according to the D/A converter 100 as illustrated in FIG. 11A. For example, the large peak waveforms appear every 16 codes from the code "8" (codes 8, 24, 40 and 56), according to the D/A converter 100. The large DNL appears when the codes change from "7" to "8", from "23" to "24", from "39" to "40", and from "55" to "56". For example, the large DNL appears at the time of the code change in which the digital input signals D0 to D2 inputted to the switches 200 to 202 having the variations in the minus direction change from the H-level to the L-level, and the digital input signal D3 inputted to the switch 203 having the variations in the plus direction changes from the L-level to the H-level. On the contrary, as illustrated in FIG. 10B, the peak values of the peak waveforms that appear every four codes are smaller with the D/A converter 1 according to this embodiment. For example, the peak values of the peak waveforms that appear every 16 codes from the code "8" are substantially smaller, with the D/A converter 1. It is possible to assume that this is because the codes "8", "24", "40" and "56" are the codes in which "0" is repeated for three times from the LSB, and according to the codes, the nodes on the LSB side are set as the open state wherever possible. By setting the nodes as the open state like this, the variations in the on-resistances on the GND line side may be reduced, and only the switch circuits SW3 to SW5 and S3 having the variations in the same direction (minus direction in this case) may be coupled to the VD line or the GND line. As the peak values of the peak waveforms are smaller, as described above, the fluctuation width (Peak to Peak) of the DNL is smaller with the D/A converter 1 according to this embodiment, as compared with that of the conventional D/A converter 100. It is possible to substantially improve the DNL characteristics with the D/A converter 1 according to this embodiment, as compared with the conventional D/A converter, by setting the nodes on the LSB side as the open state wherever possible, even when the on-resistances have the variations in both of the plus direction and the minus direction.

The following effects may be provided by the embodiment as described thus far.

The resistors R20 to R25 that are coupled to the first terminals of the resistors R10 to R15, each having the resistance 2R, are provided, and the switch circuits S0 to S5 are inserted and coupled between the second terminals of the resistors R20 to R25 and the GND line. For example, "the resistors R20 to R25 and the transistors T0 to T5 (pull-down switches) in the switch circuits S0 to S5" are provided and coupled in parallel to "the resistors R10 to R15, each having the resistance 2R, and the transistors TN0 to TN5 (pull-down switches) in the switch circuits SW0 to SW5", respectively. Further, each of the switch circuits SW0 to SW5 coupled to the resistors R10 to R15 is the tri-state buffer circuit. Furthermore, according to the code in which "0" is repeated for one or more times from the LSB, either one of the nodes NS1 to NS5, corresponding to the digital input signal that becomes "1" for the first time after "0" is repeated from the LSB, is set as the L-level, and all the nodes provided on the LSB side from the node that is set as the L-level are set as the open state. Thus, the transistors with the large on-resistances and variation ranges (transistors on the LSB side) are not turned on wherever possible, and the transistors with the small on-resistances and variation ranges (transistors on the MSB side) are turned on. When the transistors on the LSB side are not turned on, the on-resistances of the transistors that are not turned on do not affect the D/A conversion accuracy, and therefore, the on-resistances may be ignored. Consequently, when the transistors on the LSB side are not turned on, it is possible to reduce the variations in the on-resistances by the on-resistances of the transistors that are not turned on (on-resistances that easily cause the variations), as compared with the case where the transistors are turned on. Therefore, even when the bits are increased in the D/A converter 1, it is possible to suppress the increase in the variations in the on-resistances accompanying with the increase in the bits.

It is also possible to reduce the variation ranges of the on-resistances of the switch circuits SW0 to SW5 by reducing the set resistances (absolute values) of the on-resistances of the transistors TP0 to TP5 and TN0 to TN5 in the switch circuits SW0 to SW5. In order to reduce the set resistances of the on-resistances of the transistors TP0 to TP5 and TN0 to TN5, however, it is necessary to increase the channel widths of the respective transistors TP0 to TP5 and TN0 to TN5. The increase in the channel widths of the transistors TP0 to TP5 and TN0 to TN5 will increase the element areas and the circuit area of the D/A converter 1.

On the contrary, it is possible for the D/A converter 1 to suppress the increase in the variations in the on-resistances of the switch circuits SW0 to SW5 due to the increase in the bits, without increasing the element areas of the transistors TP0 to TP5 and TN0 to TN5. Therefore, the area of the D/A converter 1 may be reduced as compared with that of the D/A converter 100, when the D/A conversion accuracy of the same level is required.

The plurality of reference transistors Tp and Tn are coupled in parallel to set the low on-resistance, and the plurality of reference transistors Tp and Tn are coupled in series to set the high on-resistance. Thus, the increase in the circuit area may be suppressed. For example, when the on-resistances are weighted in the binary ratio by using only the parallel connection of the reference transistors Tp and Tn, that is, when the on-resistances are weighted by the number of the reference transistors Tp and Tn that are coupled in parallel, as illustrated in FIG. 3, the total gate area becomes Wp×Lp×126+Wn×Ln×252. Similarly, when the transistor sizes of the transistors TP0 to TP5, TN0 to TN5 and T0 to T5 are set as the sizes weighted in the binary ratio, the total gate area becomes Wp×Lp×126+Wn×Ln×252. Meanwhile, when the on-resistances are weighted in the binary ratio by using the parallel connection and the series connection of the reference transistors Tp and Tn, as illustrated in FIG. 2, the total gate area becomes Wp×Lp×42+Wn×Ln×84. Thus, the increase in the gate area may be preferably suppressed by using the series connection of the reference transistors Tp and Tn.

The series connection of the reference transistors Tp and Tn corresponds to the increase in the channel lengths Lp and Ln of the reference transistors Tp and Tn, in calculating the on-resistances of the reference transistors Tp and Tn that are coupled in series, but in actuality, the channel lengths Lp and Ln are not increased physically. Therefore, when the reference transistors Tp and Tn are coupled in series, manufacturing variations and the variations in the on-resistances are easily caused. The transistors TP0 to TP2, TN0 to TN2 and T0 to T2 on the LSB side employ the structure in which the reference transistors Tp and Tn are coupled in series, as illustrated in FIG. 2. Therefore, the variations in the on-resistances of the transistors TP0 to TP2, TN0 to TN2 and T0 to T2 on the LSB side are easily caused.

However, it is possible for the D/A converter 1 according to this embodiment to generate the analog signal Vo with the excellent D/A conversion accuracy, even though such a structure is employed. The reasons for this will be explained below.

First, according to the D/A converter 1, the transistors that are on the LSB side and easily cause the variations in the on-resistances are not turned on wherever possible, and the switch circuits S1 to S5 that are provided on the MSB side are turned on wherever possible. Thereby, when the transistors on the LSB side are not turned on, the on-resistances of the transistors that are not turned on do not affect the D/A conversion accuracy, and the on-resistances may be ignored. Consequently, when the transistors on the LSB side are not turned on, it is possible to reduce the variations in the on-resistances by the on-resistances of the transistors that are not turned on (on-resistances that easily cause the variations), as compared with the case where the transistors are turned on. Therefore, even when the variations are easily caused in the on-resistances of the transistors TP0 to TP2, TN0 to TN2 and T0 to T2 on the LSB side, it is possible to preferably suppress the reduction in the D/A conversion accuracy due to the variations.

Further, according to the R-2R type D/A converter, influences of the variations in the on-resistances on the LSB side exerted on the DNL characteristics are smaller than influences of the variations in the on-resistances on the MSB side exerted on the DNL characteristics. This will be explained with the conventional D/A converter 100 as an example.

Figure 25:
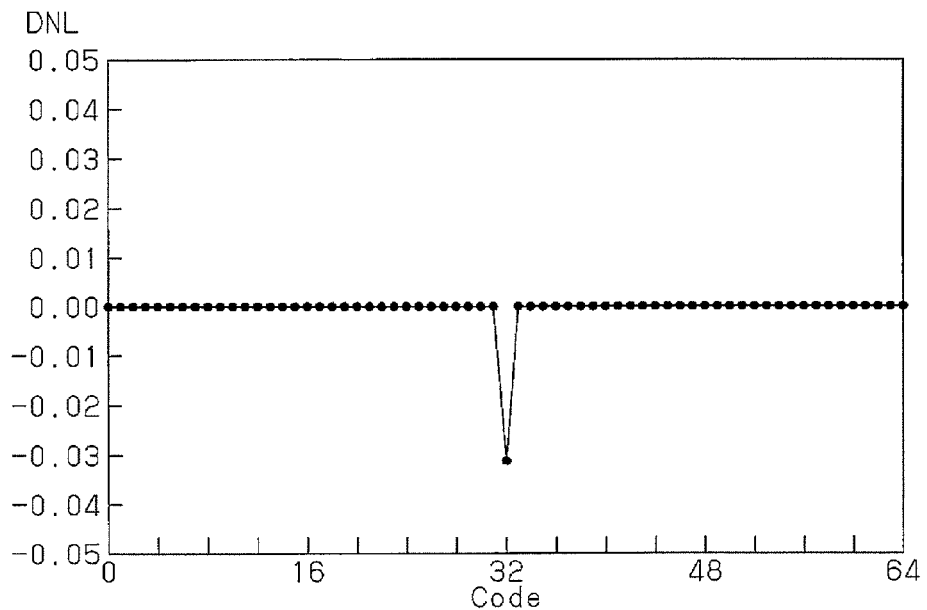
FIG. 25 is a graph explaining influences of the variations in the on-resistances of the switches on a MSB side on the DNL characteristics.
Figure 26:
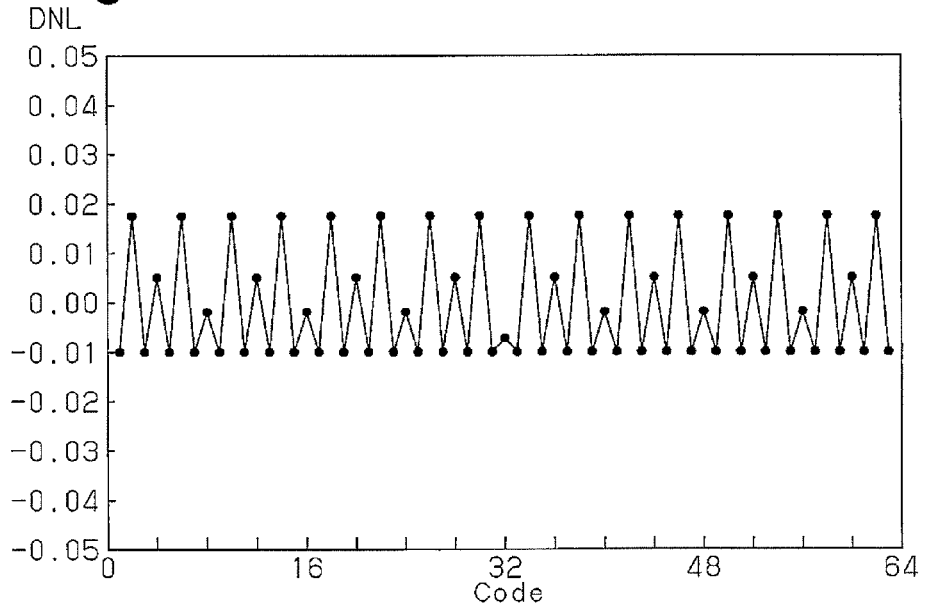
FIG. 26 is a graph explaining the influences of the variations in the on-resistances of the switches on a LSB side on the DNL characteristics.

FIG. 25 illustrates a DNL waveform of the conventional D/A converter 100 as illustrated in FIG. 21, in which only the resistance of the on-resistance R205, corresponding to the MSB, among the on-resistances R205 to R200 that are weighted in the binary ratio, is varied by +10% from the set resistance. For example, it illustrates the DNL waveform when the set resistances of the on-resistances R205 to R200 are 0.2 [kΩ], 0.4 [kΩ], 0.8 [kΩ], 1.6 [kΩ], 3.2 [kΩ] and 6.4 [kΩ], respectively, and when the resistance of only the on-resistance R205 is varied by +10% from the set resistance and is 0.22 [kΩ]. Further, FIG. 26 illustrates a DNL waveform of the conventional D/A converter 100 as illustrated in FIG. 21, in which only the resistances of the on-resistance R200 corresponding to the LSB and the on-resistance R210, among the on-resistances R200 to R205 that are weighted in the binary ratio, are varied by +10% from the set resistances. For example, it illustrates the DNL waveform when the set resistances of the on-resistances R205 to R200 and R210 are 0.2 [kΩ], 0.4 [kΩ], 0.8 [kΩ], 1.6 [kΩ], 3.2 [kΩ], 6.4 [kΩ] and 6.4 [kΩ], respectively, and when the resistances of only the on-resistances R200 and R210 are varied by +10% from the set resistances and are 7.04 [kΩ]. Thus, when the on-resistance R200 that is on the LSB side and that has the higher set resistance is varied by +10%, the absolute value of the on-resistance varied from the set resistance is 32($2^5$) times as large as that of when the on-resistance R205 on the MSB side is varied by +10%.

In the DNL waveform as illustrated in FIG. 25, the DNL characteristics deteriorate significantly at the time of the code change in which the signal level of the digital input signal D5 to be supplied to the on-resistance R205 having the +10% variations is switched, that is, when the code is switched from "31" to "32". Meanwhile, in the DNL waveform as illustrated in FIG. 24, the DNL characteristics deteriorate significantly at the time of the code change in which only the signal level of the digital input signal D0 to be supplied to the on-resistance R200 having the +10% variations is switched. As is clear from FIG. 25 and FIG. 26, the fluctuation widths (Peak to Peak) of the DNL are identical to each other between the DNL waveform as illustrated in FIG. 25 and the DNL waveform as illustrated in FIG. 26. Even though the absolute values of the on-resistances varied from the set resistances are different by 32 times between FIG. 25 and FIG. 26, the fluctuation widths of the DNL are identical to each other. Thus, it is clear that the influences of the variations in the on-resistances on the LSB side exerted on the DNL characteristics are smaller by 32 times than the influences of the variations in the on-resistances on the MSB side exerted on the DNL characteristics.

As described thus far, the influences of the variations in the on-resistances on the LSB side exerted on the DNL characteristics are smaller than the influences of the variations in the on-resistances on the MSB side exerted on the DNL characteristics, and therefore, the reduction in the D/A conversion accuracy due to the variations may be preferably suppressed even when the variations are easily caused in the on-resistances of the transistors on the LSB side.

It should be apparent to those skilled in the art that the present invention may be embodied in many other specific forms without departing from the spirit or scope of the invention. For example, it should be understood that the present invention may be embodied in the following forms.

Figure 12:
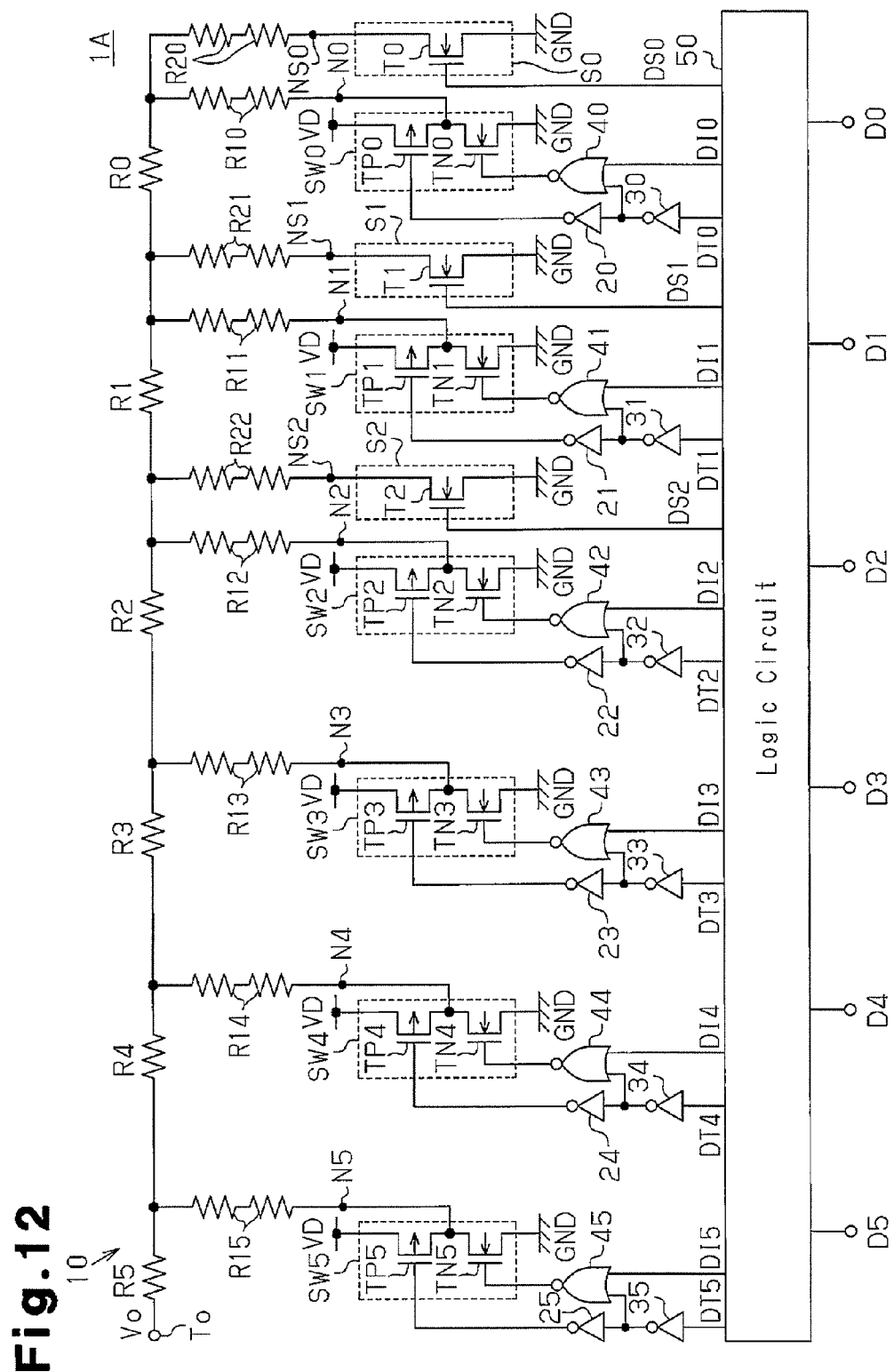
FIG. 12 is a block circuit diagram of a D/A converter according to a modification example.

According to the above-described embodiment, the resistors R21 to R25 that are coupled to the first terminals of all the resistors R11 to R15, out of the plurality of resistors R10 to R15, each having the resistance 2R, except for the resistor R10 whose first terminal is coupled to the first output terminal (first terminal of the resistor R0), are provided. This is not restrictive and, as a D/A converter 1A as illustrated in FIG. 12, for example, the resistors R21 and R22 (third resistor) that are coupled to the first terminals of some of the resistances (resistors R11 and R12 in this case: second resistor), among the resistors R11 to R15, may be provided, and the switch circuits S1 and S2 (second switch circuit) may be coupled to the resistors R21 and R22. In other words, according to the D/A converter 1A, the resistors R23, R24 and R25 and the switch circuits S3, S4 and S5 are omitted from the D/A converter 1 as illustrated in FIG. 1.

With the D/A converter 1A like this, the transistors with the large on-resistances (transistors on the LSB side) are not turned on wherever possible to the extent necessary to output the analog signal Vo with the desired voltage value according to the setting codes. For example, according to the code in which "0" is repeated from the LSB to the digital input signal D1 that a bit lower than the digital input signal D2 (first bit)

corresponding to the resistor R12 coupled to the first terminal of the resistor R22, and "1" appears as the digital input signal D2, the nodes N1, N0, NS1 and NS0 that correspond to the digital input signals D0 and D1 are set as the high impedance. According to this code, the switch circuit S2 corresponding to the digital input signal D2 is turned on and the node NS2 is set as the L-level. Further, according to the code in which "0" is repeated from the LSB to the digital input signal D0 (second bit) that a bit lower than the digital input signal D1 (first bit) corresponding to the resistor R11 coupled to the first terminal of the resistor R21, and "1" appears as the digital input signal D1, the nodes N0 and NS0 that correspond to the digital input signal D0 are set as the high impedance state. In other words, according to the code in which the LSB is "0" and the digital input signal D1 is "1", the nodes N0 and NS0 are set as the high impedance state. According to this code, the switch circuit S1 corresponding to the digital input signal D1 is turned on and the node NS1 is set as the L-level. At the same time, the switch circuit S2, other than the switch circuit S1, is turned off and the node NS2 is set as the high impedance state.

Figure 13:
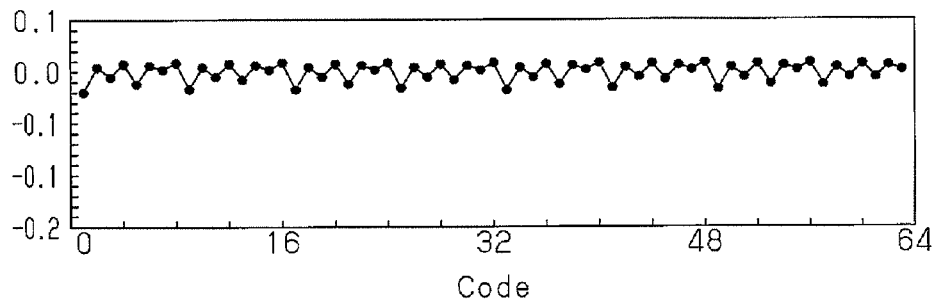
FIG. 13 is a graph of the DNL characteristics of the D/A converter according to the modification example.

Thus, the transistors that have the large on-resistances (transistors on the LSB side) are not turned on wherever possible, and the transistors that have the small on-resistances and variations and that are on the MSB side are turned on, so as to provide the similar effects as those of the above-described embodiment. In the DNL waveform as illustrated in FIG. 13, the DNL has the value close to zero according the codes with which the nodes N1, N0, NS1 and NS0 are set as the high impedance state. Thus, the excellent DNL characteristics may be obtained by the D/A converter 1A. FIG. 13 illustrates the DNL waveform of the D/A converter 1A when the on-resistances of the switch circuits SW5 to SW0 are weighted in the binary ratio.

Figure 14A:
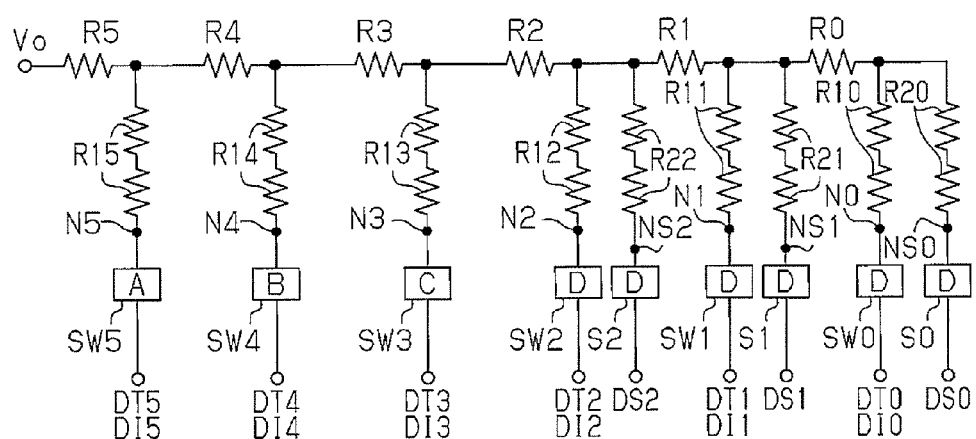
FIG. 14A is a circuit diagram of the D/A converter according to the modification example in which large variations are caused in the on-resistances of the switches.
Figure 15A:
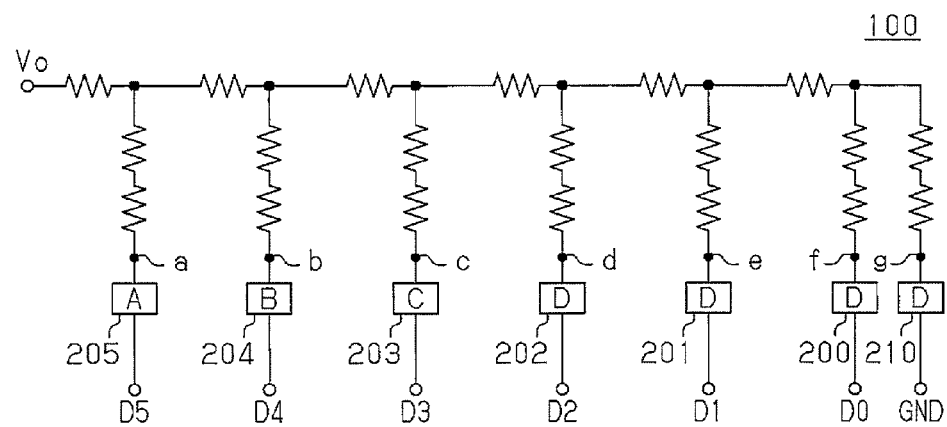
FIG. 15A is a circuit diagram of a conventional D/A converter in which large variations are caused in the on-resistances of the switches.

FIG. 14A illustrates the D/A converter 1A in which the large variations are caused in the on-resistances of the switch circuits SW2 to SW0 and S2 to S0, among the switch circuits SW5 to SW0 and S2 to S0. For example, the on-resistances of the switch circuits SW5 to SW2 are the resistances of "A", "B", "C" and "D" as illustrated in FIG. 2, that is, the resistances that are weighted in the binary ratio relative to the reference resistance of the switch circuit SW5. Meanwhile, the on-resistances of all the switch circuits SW2 to SW0 and S2 to S0 are the resistance of "D" as illustrated in FIG. 2. Thus, the on-resistances of the switch circuits SW2 to SW0 and S2 to S0 are not weighted in the binary ratio, and the variations in the on-resistances are increased. FIG. 15A illustrates the conventional D/A converter 100 in which the large variations are caused in the on-resistances of the switches 202 to 200 and 210, similarly to the D/A converter 1A as illustrated in FIG. 14A. For example, the on-resistances of the switches 205, 204, 203 and 202 are the resistances of "A", "B", "C" and "D" as illustrated in FIG. 2, and the resistances of all the switches 202, 201, 200 and 210 are the resistance of "D".

Figure 14B:
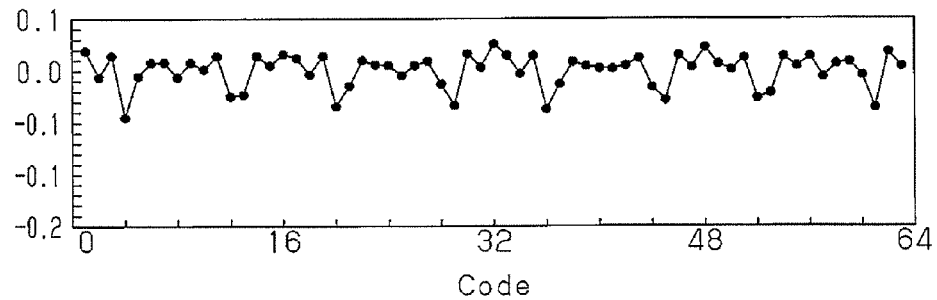
FIG. 14B is a graph of the DNL characteristics of the D/A converter of FIG. 14A.
Figure 15B:
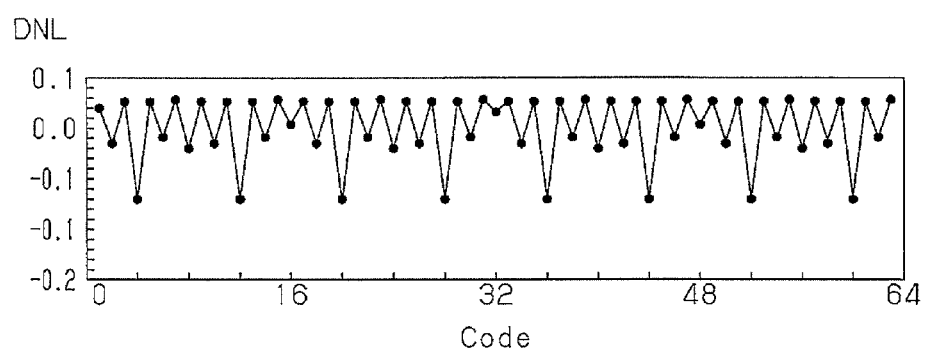
FIG. 15B is a graph of the DNL characteristics of the D/A converter of FIG. 15A.

FIG. 14B illustrates a DNL waveform of the D/A converter 1A as illustrated in FIG. 14A, and FIG. 15B illustrates a DNL waveform of the D/A converter 100 as illustrated in FIG. 15A.

As illustrated by the DNL waveform in FIG. 15B, large peak waveforms appear every two codes with the D/A converter 100 as illustrated in FIG. 15A. For example, the large peak waveforms appear every eight codes from the code 4 (codes 4, 12, 20, 28, 36, 44, 52 and 60). The large DNL appears at the time of the code change in which the digital input signals D0 and D1 to be inputted to the switches 200 and 201, having the large variations in the on-resistances, change from "1" to "0", such as when the code is changed from "3" to "4". Meanwhile, with the D/A converter 1A as illustrated in FIG. 14A, the peak values of the peak waveforms that appear every two codes are smaller, as illustrated in FIG. 14B. For example, with the D/A converter 1A, the peak values of the peak waveforms that appear every eight codes from the code "4" are substantially smaller. It is possible to assume that this is because the nodes on the LSB side are set as the open state wherever possible, according to the codes 4, 12, 20, 28, 36, 44, 52 and 60, so that the variations in the on-resistances on the GND line side may be reduced.

Figure 16:
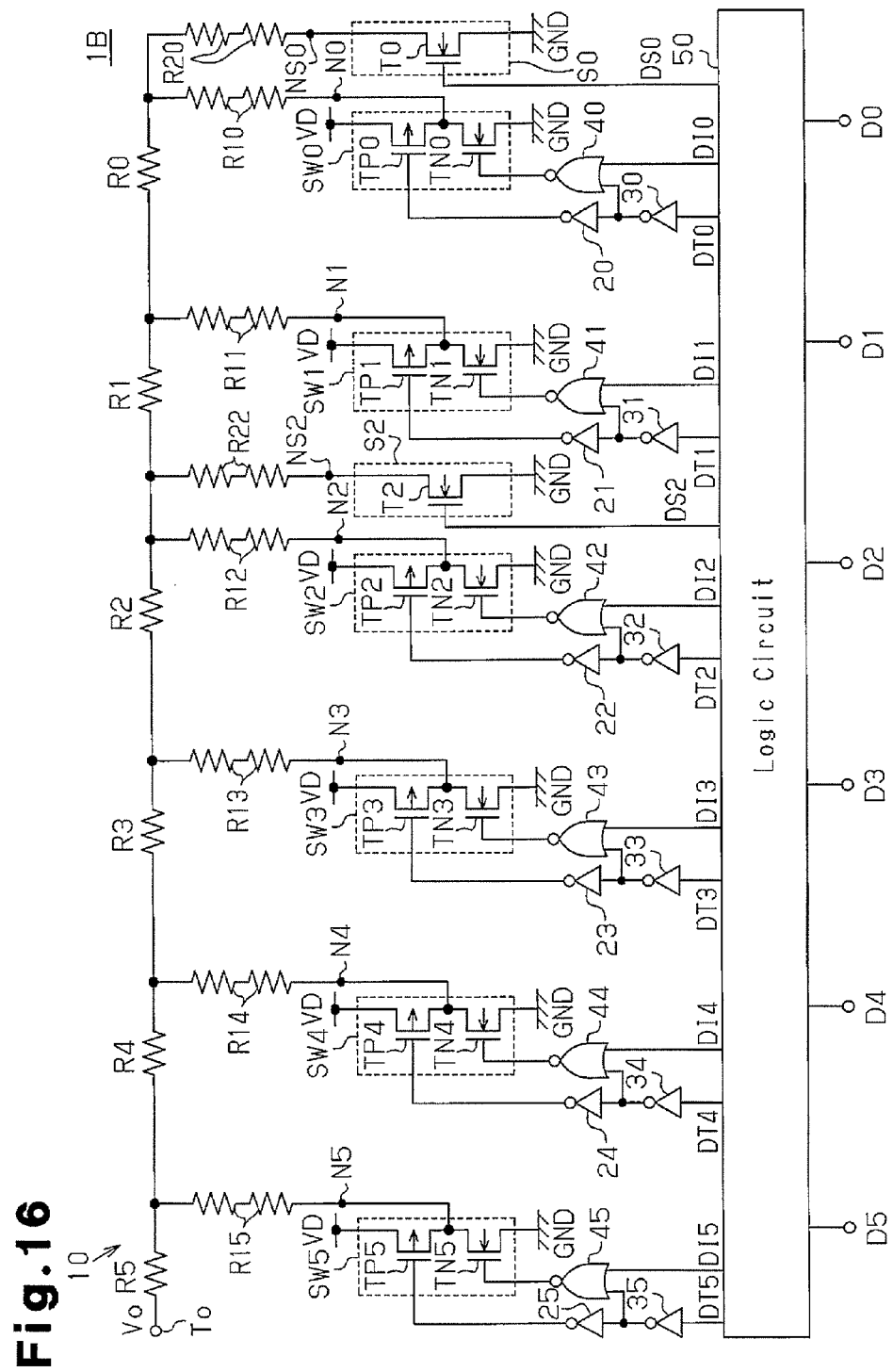
FIG. 16 is a block circuit diagram of a D/A converter according to a modification example.

According to the above-described modification example, the resistors R21 and R22 that are coupled to the first terminals of the plurality of resistors R11 and R12, among the resistors R11 to R15, are provided. However, this is not restrictive. For example, the resistor R22 (third resistor) that is coupled to the first terminal of one of the resistors R11 to R15 (resistor R12 in this case: second resistor) is provided, and the switch circuit S2 (second switch circuit) is coupled to the resistor R22, as in a D/A converter 1B as illustrated in FIG. 16. In other words, with the D/A converter 1B, the resistor R21 and the switch circuit S1 are omitted from the D/A converter 1A as illustrated in FIG. 12.

With the D/A converter 1B like this, the transistors with the large on-resistances (transistors on the LSB side) are not turned on wherever possible to the extent necessary to output the analog signal Vo with the desired voltage value according to the setting codes. For example, according to the code in which "0" is repeated from the LSB to the digital input signal D1 that is a bit lower than the digital input signal D2 (first bit) corresponding to the resistor R12 coupled to the first terminal of the resistor R22, and "1" appears as the digital input signal D2, the nodes N1, N0, NS1 and NS0 that correspond to the digital input signals D0 and D1 are set as the high impedance state. According to this code, the switch circuit S2 corresponding to the digital input signal D2 is turned on and the node NS2 is set as the L-level.

Thus, the transistors that have the large on-resistances (transistors on the LSB side) are not turned on wherever possible, and the transistors that have the small on-resistances and variations and that are on the MSB side are turned on, so as to provide the similar effects as those of the above-described embodiment.

Figure 17A:
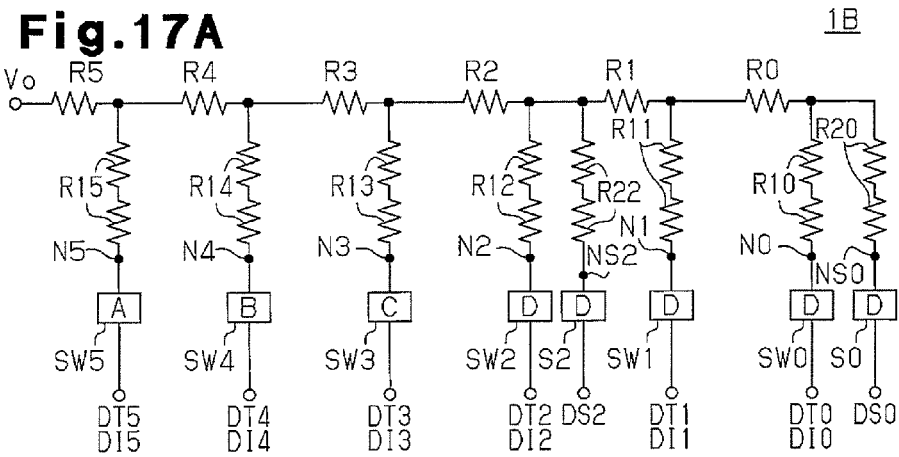
FIG. 17A is a circuit diagram of the D/A converter according to the modification example in which large variations are caused in the on-resistances of the switches.

FIG. 17A illustrates the D/A converter 1B in which the large variations are caused in the on-resistances of the switch circuits SW2 to SW0, S2 and S0, among the switch circuits SW5 to SW0, S2 and S0. For example, the on-resistances of the switch circuits SW5 to SW2 are the resistances of "A", "B", "C" and "D" as illustrated in FIG. 2, that is, the resistances that are weighted in the binary ratio relative to the reference resistance of the switch circuit SW5. Meanwhile, the on-resistances of all the switch circuits SW2 to SW0, S2 and S0 are the resistance of "D" as illustrated in FIG. 2. Thus, the on-resistances of the switch circuits SW2 to SW0, S2 and S0 are not weighted in the binary ratio, and the variations in the on-resistances are increased.

Figure 17B:
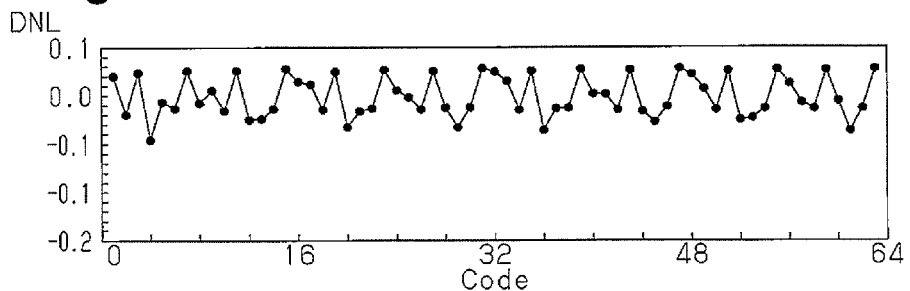
FIG. 17B is a graph of the DNL characteristics of the D/A converter of FIG. 17A.
Figure 17C:
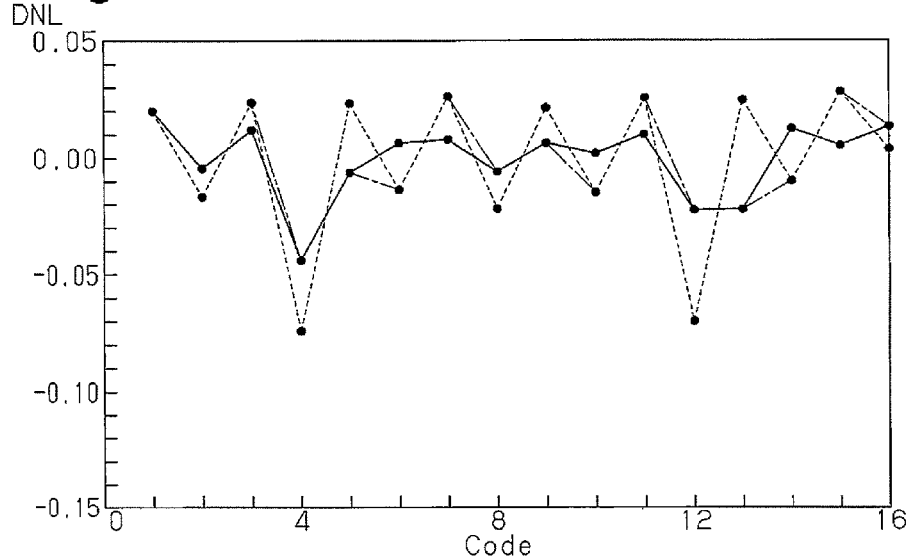
FIG. 17C is a graph of the DNL characteristics of the D/A converters of FIGS. 14A, 15A, and 17A.

FIG. 17B illustrates a DNL waveform of the D/A converter 1B as illustrated in FIG. 17A, and FIG. 17C illustrates the DNL waveform of the D/A converter 1A as illustrated in FIG. 14A (refer to the solid line), the DNL waveform of the D/A converter 1B as illustrated in FIG. 17A (refer to the alternate long and short dash line), and the DNL waveform of the conventional D/A converter 100 as illustrated in FIG. 15A (refer to the broken line). FIG. 17C enlarges and illustrates the DNL according to the codes "0" to "16".

With the D/A converter 1B as illustrated in FIG. 17B, the peak values of the peak waveforms that appear every eight codes from the code "4" are smaller as those of the conventional D/A converter 100 as illustrated in FIG. 15B. It is possible to assume that this is because the nodes on the LSB side are set as the open state wherever possible, according to the codes 4, 12, 20, 28, 36, 44, 52 and 60, so that the variations in the on-resistances on the GND line side may be reduced.

Further, as illustrated in FIG. 17C, with the D/A converters 1A and 1B as illustrated in FIG. 14A and FIG. 17B, respectively, the DNL according to the codes 4, 12, 20, 28, 36, 44, 52 and 60 is smaller than that of the conventional D/A converter 100. Furthermore, with the D/A converter 1A as illustrated in FIG. 14A, the DNL according to the codes except for the above-described codes 4, 12, 20, 28, 36, 44, 52 and 60 is smaller as a whole than that of the D/A converter 1B as illustrated in FIG. 17B. As a result of this, it is clear that the more excellent DNL characteristics may be obtained when the resistors R21 and R22 are coupled to the first terminals of the plurality of resistors R11 and R12, among the resistors R11 to R15, than when the resistor R22 is coupled to the first terminal of one resistor R12.

Figure 18:
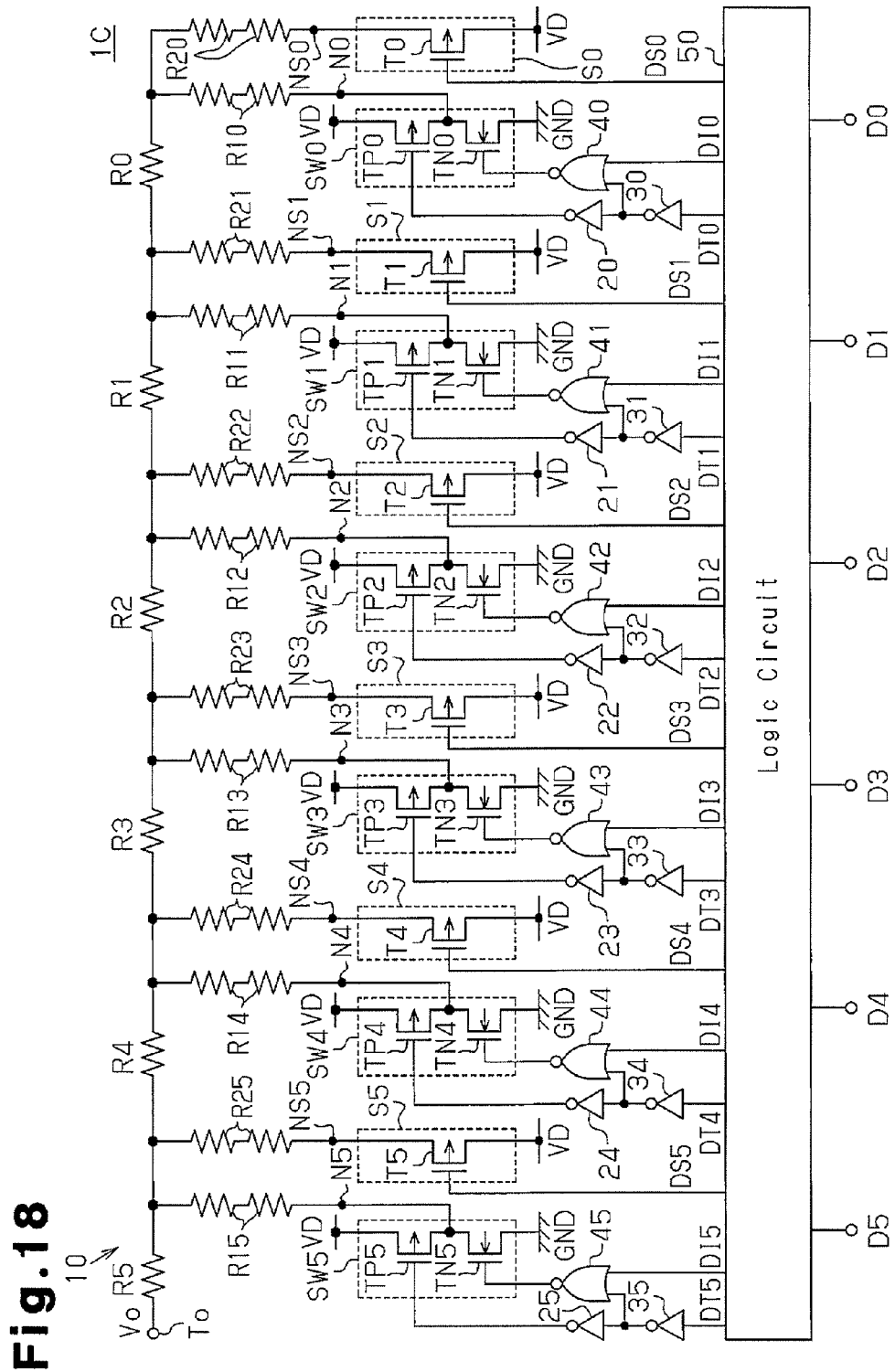
FIG. 18 is a block circuit diagram of a D/A converter according to a modification example.

According to the above-described embodiment and modification examples, the transistors with the large on-resistances (transistors on the LSB side) are not turned on wherever possible to the extent necessary to output the analog signal Vo with the desired voltage value according to the code in which "0" is repeated for one or more times from the LSB. This is not restrictive, and the transistors with the large on-resistances may not be turned on wherever possible to the extent necessary to output the analog signal Vo with the desired voltage value according to the code in which, for example, "1" is repeated for one or more times from the LSB. In this case, the switch circuits S0 to S5 are inserted and coupled between the nodes NS0 to NS5 and the VD line, as illustrated in FIG. 18, for example. Further, the transistors T0 to T5 in the switch circuits S0 to S5 are changed from the N-channel MOS transistors to the P-channel MOS transistors.

With a D/A converter 1C as illustrated in FIG. 18, the nodes NS1 to NS5 corresponding to the digital input signal that becomes "0" for the first time after "1" is repeated from the LSB are set as the H-level, and all the nodes, provided on the LSB side from the node that is set as the H-level, are set as the open state, according to the code in which "1" is repeated for one or more times from the LSB. The voltage state (connection state) on the MSB side (upper bit side) from the digital input signal that becomes "0" for the first time is set similarly to that of the conventional D/A converter 100. Thus, when "1" is repeated for one or more times from the LSB, the node on the LSB side that corresponds to the digital input signal as "1" is set as the open state, so that the transistors on the LSB side that have the high on-resistances are not turned on wherever possible. Thereby, the similar effects as those of the above-described embodiment may be provided.

With the D/A converter 1C, the nodes N0 to N5 are coupled to the GND line or the VD line in response to the digital input signals D0 to D5, according to the code in which the digital input signal D0 as the LSB becomes "0". Further, the node NS0 of the switch circuit S0 corresponding to the LSB is coupled to the VD line, and the nodes NS1 to NS5 of other switch circuits S1 to S5 are set as the open state. Thus, with the D/A converter 1C as illustrated in FIG. 18, the analog signal Vo when the code is "0" is 0.1 [V], and the analog signal Vo when the code is "63" is 6.4 [V].

According to the modification examples as illustrated in FIG. 12 and FIG. 16, the switch circuits SW3 to SW5 that are coupled to the resistors R13 to R15 whose first terminals are not coupled to the third resistor (resistors R23 to R25, for example) also employ the tri-state buffer circuit, similarly to the switch circuits SW3 to SW5 according to the above-described embodiment. This is not restrictive, and the switch circuits SW3 to SW5 that are provided on the second output terminal side from the node between the resistors R1 and R2 coupled to the third resistor that is provided on the uppermost bit side (resistor R22 in this case) may be changed to the CMOS inverter circuits that are similar to the switches 200 to 205 in the conventional D/A converter 100. In other words, it is enough when at least the switch circuits SW0 to SW2, out of the switch circuits SW0 to SW5, are the tri-state buffer circuits, the switch circuits SW0 to SW2 being coupled to the resistors R10 to R12 whose first terminals are coupled between the node located between the resistors R1 and R2, to which the first terminal of the resistance 22 as one example of the third resistor is coupled, and the first output terminal (first terminal of the resistor R0).

The above-described embodiment and modification examples employ the 6-bit D/A converters 1, 1A to 1C of the R-2R ladder resistor type, but the number of bits of the D/A converters 1, 1A to 1C may be changed as appropriate.

According to the above-described embodiment and modification examples, the high voltage VD is set as 6.4 [V] and the low voltage GND is set as 0.0 [V], but the voltage values may be changed as appropriate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although embodiments of the present invention have been described in detail, it should be understood that various changes, substitutions, and alterations could be made hereto without departing from the spirit and scope of the invention.

What is claimed is:

1. A digital-to-analog (D/A) converter that generates an analog signal according to digital input signals, the D/A converter comprising:
    a plurality of first resistors coupled in series between a first output terminal and a second output terminal from which the analog signal is outputted, the first resistors having a same resistance;
    a plurality of second resistors including first terminals respectively coupled to the plurality of first resistors and each having a resistance twice as large as the resistance of the first resistor, the first output terminal being coupled to the first terminal of one of the plurality of second resistors;
    a plurality of first switch circuits respectively coupled to second terminals of the plurality of the second resistors;
    at least one third resistor having a resistance twice as large as the resistance of the first resistor and including a first terminal coupled to one of the first terminals of the second resistors except for one second resistor that is coupled to the first output terminal;
    a second switch circuit including a first terminal coupled to a second terminal of the at least one third resistor and a second terminal coupled to a first wire; and
    a control circuit coupled to the first and second switch circuits and configured to generate a first signal to control the first switch circuits and to generate a second signal to control the second switch circuit, in accordance with the digital input signals,
    wherein one or more of the plurality of the first switch circuits, which is coupled to the second resistor that is coupled to a node between the first output terminal and a connection node arranged between two adjacent first resistors and to which the first terminal of the third resistor is coupled, is controlled to set a state of a connection node arranged between the one or more first switch circuit and the corresponding second resistor to either one of a first voltage, a second voltage that is different from the first voltage, and a high impedance.

2. The D/A converter according to claim 1, wherein each first switch circuit includes
a first transistor coupled between the connection node, arranged between the first switch circuit and the corresponding second resistor, and a low voltage node having the first voltage, and
a second transistor coupled between the connection node, arranged between the first switch circuit and the corresponding second resistor, and a high voltage node having the second voltage,
and wherein each first switch circuit outputs, in accordance with the first signal, the first voltage or the second voltage to the connection node arranged between the first switch circuit and the corresponding second resistor.

3. The D/A converter according to claim 1, wherein the control circuit turns on the second switch circuit, and allows each of the first switch circuits to be the high impedance, each of the first switch circuits being coupled to the second resistor that is coupled to a connection node of the first resistors, arranged on a first output terminal side from the connection node between the third resistor and the second resistor that is turned on.

4. The D/A converter according to claim 3, wherein the control circuit turns on either one of a plurality of the second switch circuits that are coupled to a plurality of the third resistors.

5. The D/A converter according to claim 1, further comprising:
a fourth resistor including a first terminal coupled to the first output terminal and having a resistance twice as large as the resistance of the first resistor; and
a third switch circuit including a first terminal coupled to a second terminal of the fourth resistor and a second terminal coupled to the first wire,
wherein the control circuit generates a third signal to control the third switch circuit in accordance with the digital input signals.

6. The D/A converter according to claim 5, wherein when the digital input signals indicate a first code in which a first logic level, corresponding to the first voltage, is repeated from a least significant bit of the digital input signals to a second bit that is a next bit lower than a first bit, and a second logic level, corresponding to the second voltage, appears at the first bit, the control circuit is configured to
generate the first signal to set the connection nodes between the first switch circuits and the second resistors, corresponding to the bits from the least significant bit to the second bit, to the high impedance,
generate the first signal to set the connection node between the first switch circuit and the second resistor, corresponding to the first bit, to the second voltage,
generate the second signal to turn on the second switch circuit corresponding to the first bit, and
generate the third signal to turn off the third switch circuit.

7. The D/A converter according to claim 6, wherein, when the digital input signals indicate a code different from the first code, the control circuit generates the second signal to turn off the second switch circuit, and generates the third signal to turn on the third switch circuit.

8. The D/A converter according to claim 6, wherein
the third resistor includes a fifth resistor including a first terminal coupled to the first terminal of the second resistor corresponding to a most significant bit of the digital input signals,
the second switch circuit includes a fourth switch circuit coupled to a second terminal of the fifth resistor, and
when all the bits of the digital input signals, from the least significant bit to the most significant bit, have the first logic level, the control circuit is configured to
generate the first signal to set the connection node between the first switch circuit and the second resistor, corresponding to the most significant bit, to the first voltage,
generate the first signal to set the connection nodes between the first switch circuits and the second resistors, corresponding to the bits except for the most significant bit, to the high impedance,
generate the second signal to turn on the fourth switch circuit, and
generate the third signal to turn off the third switch circuit.

9. The D/A converter according to claim 6, wherein
at least one the third resistor is one of a plurality of the third resistors and the second switch circuit is one of a plurality of the second switch circuits, and
when the digital input signals indicate the first code, the control circuit is configured to
generate the second signal to turn on the second switch circuit corresponding to the first bit,
generate the second signal to turn off the second switch circuit corresponding to the bits except for the first bit, and
generate the third signal to turn off the third switch circuit.

10. The D/A converter according to claim 1, wherein
the first switch circuit that is coupled to the second terminal of the second resistor coupled to the first output terminal corresponds to a least significant bit of the digital input signals, and
the first switch circuit that is coupled to the second terminal of the second resistor coupled to one terminal of the first resistor whose another terminal is coupled to the second output terminal corresponds to a most significant bit of the digital input signals.

11. The D/A converter according to claim 1, wherein the third resistor and the second switch circuit are provided for each of the second resistors except for the second resistor whose first terminal is coupled to the first output terminal.

12. The D/A converter according to claim 1, wherein
each of the first switch circuits includes a first transistor coupled between the second terminal of the second resistor and the first wire having the first voltage, and a second transistor coupled between the second terminal of the second resistor and a second wire having the second voltage, the first transistors of the first switch circuits having on-resistances set in a ratio of power of two, the second transistors of the first switch circuits having on-resistances set in a ratio of power of two,
at least the first transistors or the second transistors are turned off in response to the first signal, and
the second switch circuit includes a third transistor including a first terminal coupled to the second terminal of the at least one third resistor, a second terminal coupled to the first wire, and a control terminal that receives the second signal.

13. The D/A converter according to claim 12, wherein
at least one of the plurality of the first transistors has a structure in which a plurality of first MOS transistors are coupled in series, and
at least one of the plurality of the second transistors has a structure in which a plurality of second MOS transistors are coupled in series.

* * * * *